(12) United States Patent
Kanazawa et al.

(10) Patent No.: US 9,048,119 B2
(45) Date of Patent: Jun. 2, 2015

(54) SEMICONDUCTOR DEVICE WITH NORMALLY OFF AND NORMALLY ON TRANSISTORS

(71) Applicant: RENESAS ELECTRONICS CORPORATION, Kanagawa (JP)

(72) Inventors: Takamitsu Kanazawa, Kanagawa (JP); Satoru Akiyama, Machida (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 13/909,293

(22) Filed: Jun. 4, 2013

(65) Prior Publication Data
US 2013/0335134 A1 Dec. 19, 2013

(30) Foreign Application Priority Data

Jun. 18, 2012 (JP) ................................. 2012-136591

(51) Int. Cl.
| | |
|---|---|
| *H03K 17/60* | (2006.01) |
| *H01L 27/088* | (2006.01) |
| *H01L 29/16* | (2006.01) |
| *H03K 3/012* | (2006.01) |
| *H03K 17/10* | (2006.01) |
| *H03K 17/567* | (2006.01) |
| *H01L 29/78* | (2006.01) |
| *H01L 23/495* | (2006.01) |
| *H03K 17/687* | (2006.01) |

(52) U.S. Cl.
CPC ........ *H01L 27/0883* (2013.01); *H01L 29/1608* (2013.01); *H03K 3/012* (2013.01); *H03K 17/102* (2013.01); *H03K 17/107* (2013.01); *H03K 17/567* (2013.01); *H03K 2017/6875* (2013.01); *H01L 29/7827* (2013.01); *H01L 23/49562* (2013.01); *H01L 23/49575* (2013.01); *H01L 2224/0603* (2013.01); *H01L 2224/48091* (2013.01); *H01L 2224/48247* (2013.01); *H01L 2224/49111* (2013.01); *H01L 2924/30107* (2013.01); *H01L 2924/3011* (2013.01); *H01L 2924/13091* (2013.01)

(58) Field of Classification Search
CPC .. H03K 17/081; H03K 17/567; H03K 17/687
USPC .......................................... 327/108, 112, 430
See application file for complete search history.

(56) References Cited

U.S. PATENT DOCUMENTS

| | | | | |
|---|---|---|---|---|
| 4,523,111 A | * | 6/1985 | Baliga ........................... | 327/388 |
| 4,663,547 A | | 5/1987 | Baliga et al. | |
| 5,051,618 A | * | 9/1991 | Lou ................................ | 326/34 |
| 6,373,318 B1 | * | 4/2002 | Dohnke et al. ................ | 327/427 |

(Continued)

OTHER PUBLICATIONS

2SK3069 Datasheet, Renesas, dated on Sep. 7, 2005.

*Primary Examiner* — Kenneth Wells
(74) *Attorney, Agent, or Firm* — Mattingly & Malur, PC

(57) ABSTRACT

There exists a possibility that a semiconductor device configured with a normally-on JFET and a normally-off MOSFET which are coupled in cascade may break by erroneous conduction, etc. A semiconductor device is configured with a normally-on SiCJFET and a normally-off Si-type MOSFET. The normally-on SiCJFET and the normally-off Si-type MOSFET are coupled in cascade and configure a switching circuit. According to one input signal, the normally-on SiCJFET and the normally-off Si-type MOSFET are controlled so as to have a period in which both transistors are set in an OFF state.

9 Claims, 12 Drawing Sheets

(56) References Cited

U.S. PATENT DOCUMENTS

| | | | |
|---|---|---|---|
| 6,535,050 B2* | 3/2003 | Baudelot et al. | 327/430 |
| 6,633,195 B2* | 10/2003 | Baudelot et al. | 327/430 |
| 7,082,020 B2* | 7/2006 | Friedrichs et al. | 361/93.9 |
| 7,206,178 B2* | 4/2007 | Friedrichs et al. | 361/93.1 |
| 7,245,175 B2* | 7/2007 | Morita | 327/427 |
| 7,719,055 B1* | 5/2010 | McNutt et al. | 257/341 |
| 7,764,098 B2* | 7/2010 | Yang et al. | 327/198 |
| 7,777,553 B2 | 8/2010 | Friedrichs | |
| 7,825,467 B2* | 11/2010 | Willmeroth et al. | 257/341 |
| 8,228,114 B1* | 7/2012 | Cilio | 327/430 |
| 8,487,667 B2* | 7/2013 | Iwamura | 327/109 |
| 8,558,584 B2* | 10/2013 | Draxelmayr et al. | 327/108 |
| 8,649,198 B2* | 2/2014 | Kuzumaki et al. | 363/132 |

* cited by examiner

FIG. 1
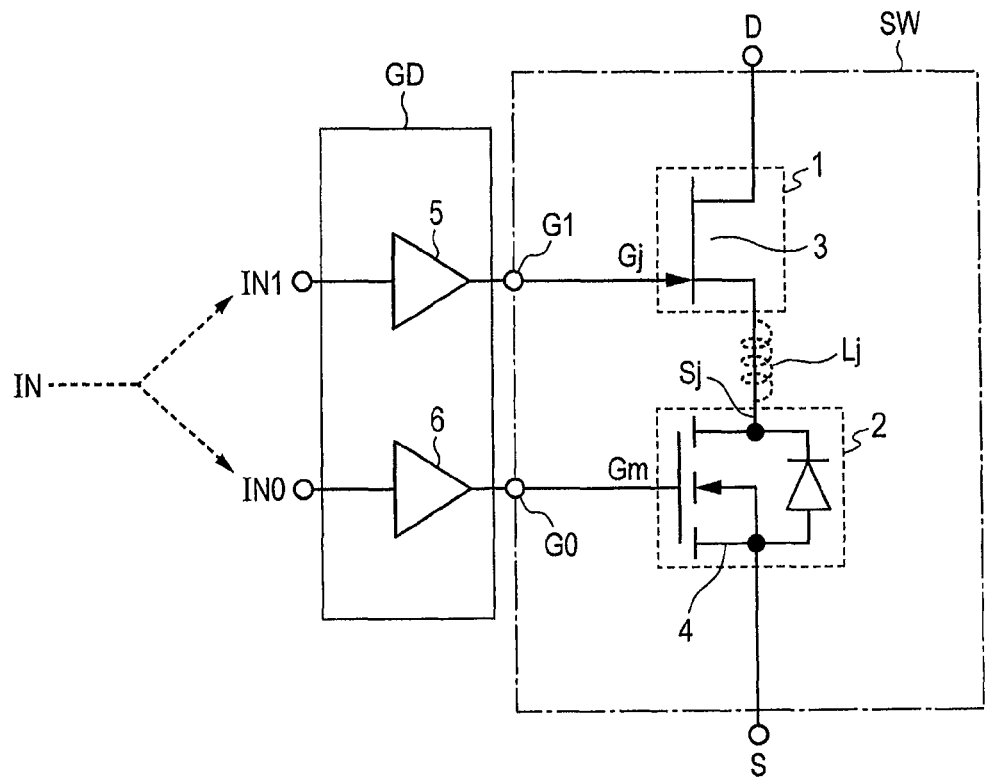
FIG. 2A  Gj
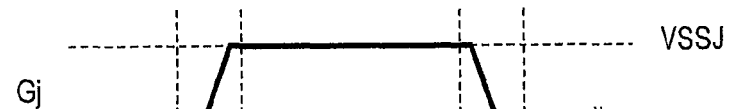
FIG. 2B  Gm
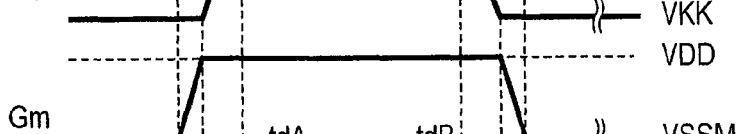
FIG. 2C  Sj
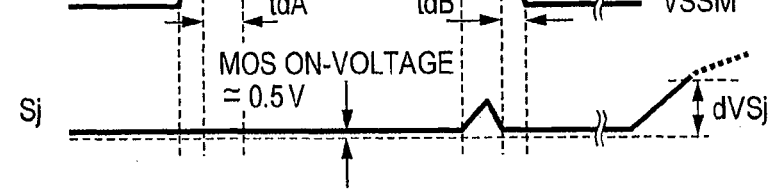

FIG. 4A  VD(U)
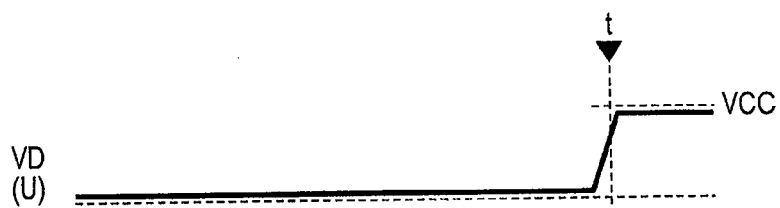
FIG. 4B  Gj
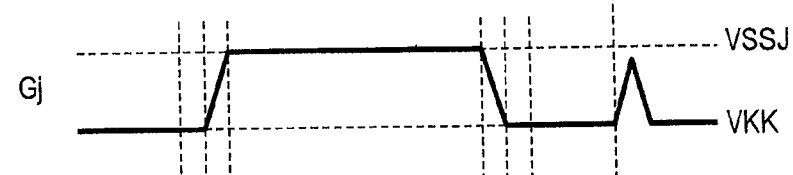
FIG. 4C  Gm
FIG. 4D  Sj
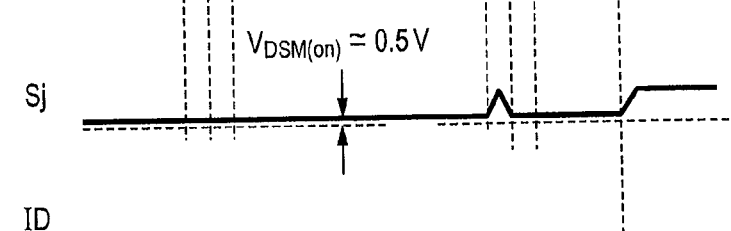
FIG. 4E  ID

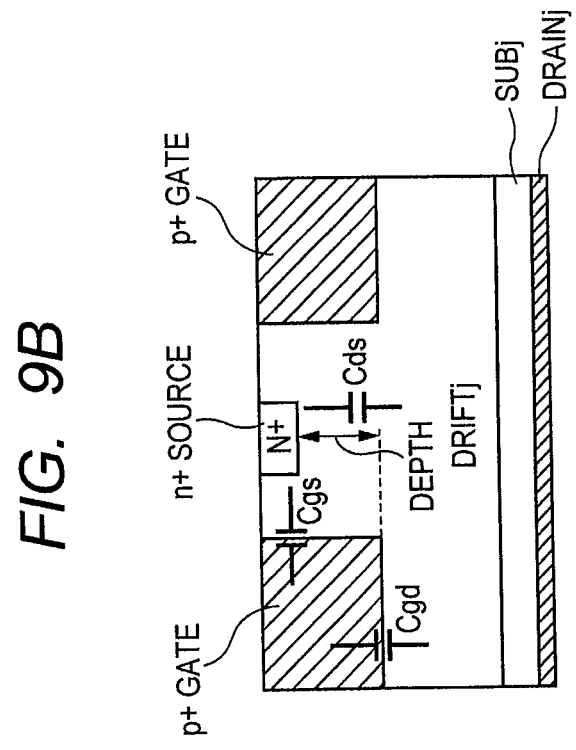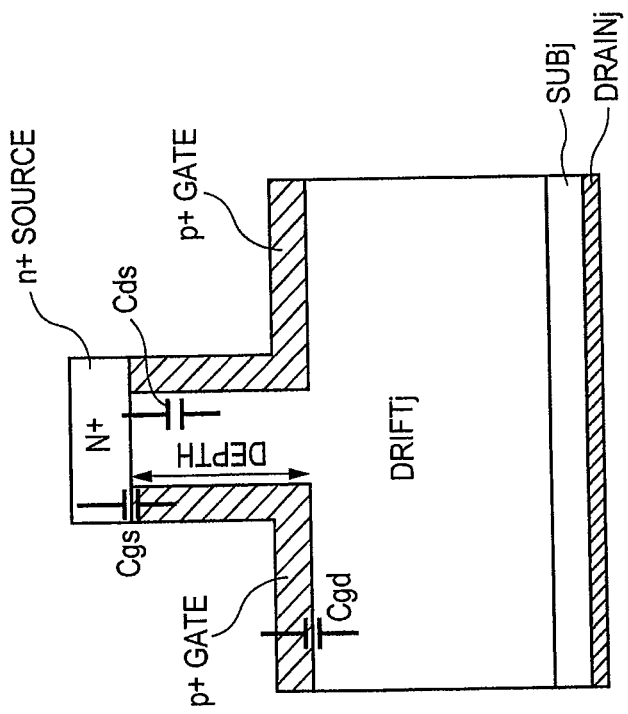

*FIG. 11A*
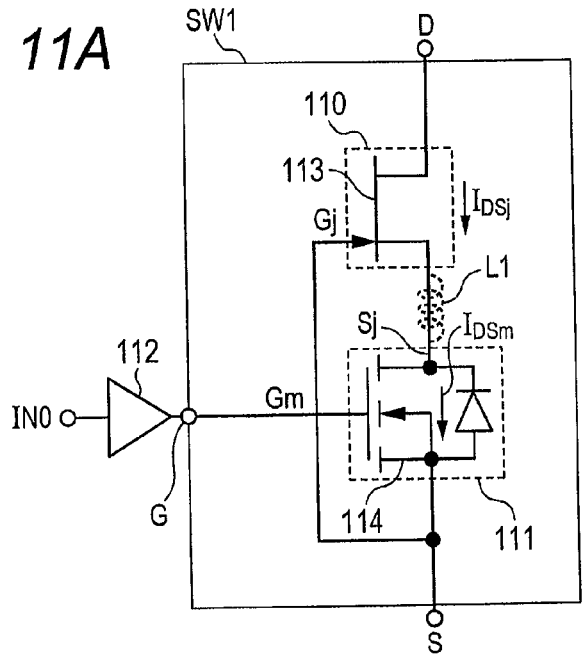
*FIG. 11B* Gj(S)
*FIG. 11C* Gm
*FIG. 11D* Sj
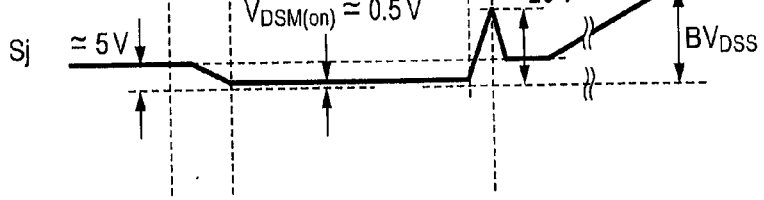

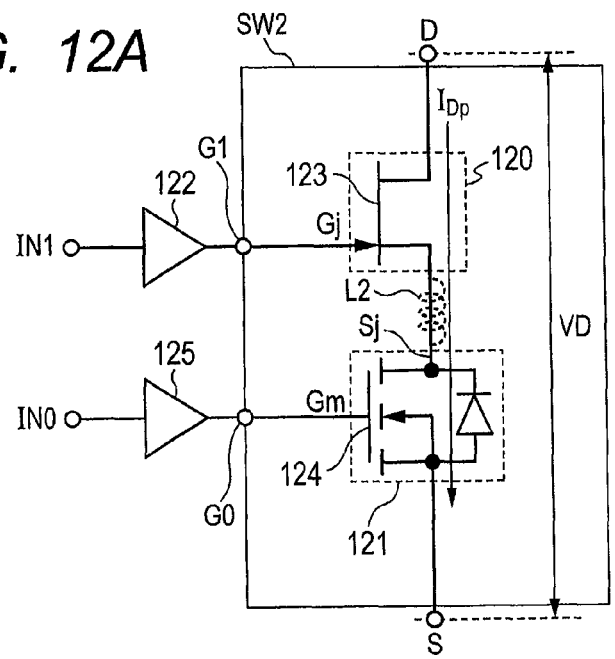
FIG. 12A
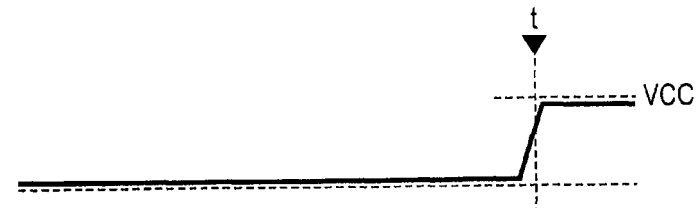
FIG. 12B  VD
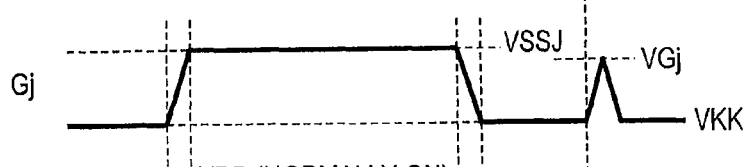
FIG. 12C  Gj
FIG. 12D  Gm
FIG. 12E  Sj
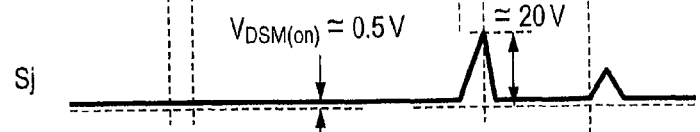
FIG. 12F  ID
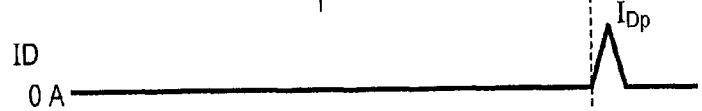

SEMICONDUCTOR DEVICE WITH NORMALLY OFF AND NORMALLY ON TRANSISTORS

CROSS-REFERENCE TO RELATED APPLICATIONS

The disclosure of Japanese Patent Application No. 2012-136591 filed on Jun. 18, 2012 including the specification, drawings and abstract is incorporated herein by reference in its entirety.

BACKGROUND

The present invention relates to a semiconductor device and technology which is applicable to a power semiconductor device and a system using the same, for example.

In the large social movement of global environmental conservation, the importance of the electronics business which reduces an environmental burden is increasing. Especially, a power semiconductor device (also called a power device hereinafter) is employed in an inverter device of a railway vehicle, a hybrid vehicle, and an electric vehicle, in an inverter device of an air-conditioner, and in a power supply system of consumer devices such as a personal computer. The performance improvement of a power device contributes greatly to the power efficiency improvement of an infrastructure system or a consumer device. The power efficiency improvement means that energy resources necessary for operation of a system can be reduced; in other words, it means the reduction of a carbon dioxide emission, that is, the mitigation of the environmental burden. Accordingly, research and development aiming at the performance improvement of the power device are carried out actively in various companies.

A power device is often formed by employing silicon as a material, as is the case with an ordinary semiconductor integrated circuit (also called a device hereinafter). In a power conversion device (such as an inverter device) which uses a power device employing silicon (also called Si hereinafter) as a material, in order to reduce the energy loss generated in the inverter device, active development is performed for optimizing the element structure of a diode and a switching element and the profile of impurity concentration, thereby realizing a low on-resistance and a high current density. Moreover, as a material for power devices, a great attention has been directed in recent years toward a compound semiconductor such as silicon carbide (SiC) and gallium nitride (GaN) which are materials with a larger band gap than silicon (also called a wide band gap material hereinafter). The compound semiconductor has a large band gap and exhibits a destruction withstand voltage about 10 times higher than that of silicon. Accordingly, a compound semiconductor-based semiconductor device can make its film thickness thinner than a Si device and can reduce greatly the value of conduction resistance (Ron) of a switching element. Consequently, it is possible to reduce the so-called conduction loss (Ron×i×i), expressed by the product of resistance (Ron) and conduction current (i), contributing to the power efficiency improvement greatly. Paying attention to such a feature, development work of a diode and a switching element which utilize the compound semiconductor as a material is being actively conducted domestically and internationally.

When focusing on a switching device, commercialization of product is promoted quickly for a junction FET (called JFET hereinafter) as a compound semiconductor which employs SiC as the material. A JFET does not require an oxide film as compared with a MOSFET; therefore, there are few issues of the defect in the interface between the oxide film and the SiC and of the accompanying degradation of the element characteristic. Moreover, in a JFET, it is possible to control ON and OFF of the JFET by controlling the spread of a depletion layer formed in a PN junction; therefore, it is also easy to manufacture a normally-off element and a normally-on element separately. In this way, when compared with the MOSFET, the JFET has features that it is excellent in the long term reliability and is easy to manufacture as an element.

However, a normally-off JFET has the following issues. The gate region and source region of the JFET are semiconductor regions respectively having P-type conduction and N-type conduction, and have the so-called PN junction diode structure. Therefore, when the voltage between a gate and a source reaches about 3V, a parasitic diode between the gate and the source turns into an ON state. As a result, large current may flow between the gate and the source and the JFET may generate heat excessively, leading to breakdown. Accordingly, when the JFET is utilized as a normally-off switching element, it is desirable to utilize the JFET by limiting the voltage between the gate and the source to a low voltage of about 2.5V, and keeping the JFET in the state where the parasitic diode is not activated into an ON state or in the state where the diode current which flows between the gate and the source is sufficiently small.

In an ordinary MOSFET made from silicon, a normally-off MOSFET is set into an ON state, by the application of a gate voltage from 0V to about 15V or 20V. Accordingly, in order to utilize a normally-off JFET instead of a normally-off MOSFET, it is necessary to add to the existing gate driving circuit of a MOSFET, a step-down circuit (for example, a DC-DC converter) or a level conversion circuit, etc. which converts the gate voltage of about 15V or 20V into a voltage of about 2.5V. A design change and addition of components for that purpose will raise the cost of the whole system. In this way, although a JFET has features of being excellent in long term reliability and being easy to manufacture, the drive voltage of a gate is greatly different from that of a general MOSFET; therefore, there arises an issue that a large design change of a drive circuit becomes necessary, raising the cost of the whole system.

One of the methods of solving the present issue is a cascode connection method disclosed by Patent Literature 1. In the connection method, a normally-on JFET element and a MOSFET of a low withstand voltage are coupled in series. When coupled in this way, a drive circuit which drives a gate will drive the MOSFET; accordingly, it is not necessary to change the drive circuit. Furthermore, since it is series coupling, the withstand voltage between a drain and a source as both ends of the series coupling is determined by the characteristics of the JFET. Even when coupled in series, the on-resistance as a cascode element comprised of the series coupling of the JFET and the MOSFET is also suppressed comparatively small, because it is the series coupling of the low on-resistance of the JFET and the low on-resistance of the MOSFET of a low withstand voltage. In this way, the cascode connection method does not require the additional circuit (for example, the step-down circuit or the level conversion circuit described above) which is required when utilizing a normally-off JFET; accordingly it may be able to provide an easy-to-use switching element.

Patent Literature 2 discloses that in the cascode connection method, the gates of a JFET and a MOSFET are respectively driven by a drive circuit. In this method, an ON state voltage is applied to the MOSFET at the time of operation, and the MOSFET is set always in an ON state, as described in Rows 61 to 66 of Column 1 and Rows 30 to 40 of Column 4 of Patent Literature 2. In making it operate as a switching element of the cascode connection, 0V or a negative potential is applied to the gate of the JFET, thereby making it perform an ON and OFF operation. By such a control, it is possible to utilize the feature of the low on-resistance which the normally-on JFET has, and it is possible to reduce the conduction loss.

(Patent Literature 1) U.S. Pat. No. 4,663,547
(Patent Literature 2) U.S. Pat. No. 7,777,553
(Non Patent Literature 1) 2SK3069 Datasheet, dated on Sep. 7, 2005

SUMMARY

The examination performed by the present inventors on Patent Literature 1 and Patent Literature 2 has revealed that there exists the following new issue.

(1) Examination on Patent Literature 1

When examining a circuit disclosed by Patent Literature 1, the circuit has been prepared based on Patent Literature 1 for the purpose of examination. The circuit prepared for the purpose of examination is illustrated in FIG. 11. As illustrated in a diagram (A) of FIG. 11, a SiCJFET 113 and a Si-type MOSFET 114 are coupled in cascode to configure a switching element SW1. The switching element SW1 is provided with a drain terminal D, a source terminal S, and a gate terminal G. A gate Gj of the SiCJFET 113 is coupled to a ground potential point of the circuit, via the source terminal S. An input signal IN0 is supplied to the gate Gm of the Si-type MOSFET 114 via a drive circuit 112 and the gate terminal G. That is, according to the input signal IN0, a high level (a positive potential VDD) or a low level (a ground potential VSSM) is supplied to the gate Gm of the Si-type MOSFET 114 from the gate driving circuit (also called a driver circuit hereinafter) 112. In the figure, a coil depicted by a dashed line indicates a parasitic inductance L1, an arrow directed to a source from a drain of the SiCJFET 113 indicates leakage current IDSj, and an arrow directed from a drain to a source of the Si-type MOSFET 114 indicates leakage current IDSm. A symbol 110 and a symbol 111 depicted by dashed lines indicate semiconductor chips in which the SiCJFET 113 and the Si-type MOSFET 114 are formed, respectively.

Waveforms (B)-(D) of FIG. 11 illustrate operating waveforms of the circuit illustrated in the diagram (A) of FIG. 11. Next, a new issue is described, with reference to the operating waveforms (B)-(D) of FIG. 11. When the potential of the signal supplied to the gate Gm of the Si-type MOSFET 114 changes from a high level (a positive potential VDD) to a low level (a ground potential VSSM), as illustrated in the waveform (C) of FIG. 11, the Si-type MOSFET 114 changes from an ON state to an OFF state. The SiCJFET 113 is a normally-on transistor of which the gate Gj is supplied with the ground potential (0V) as illustrated in the waveform (B) of FIG. 11. Therefore, in response to the Si-type MOSFET 114 changing to an OFF state, the potential at the drain Sj of the Si-type MOSFET 114 rises, for example to about 5V, as illustrated in the waveform (D) of FIG. 11. When the potential of the drain Sj rises, the potential of the gate Gj of the SiCJFET 113 turns into a negative potential (for example, −5V) relative to the source of the SiCJFET 113, accordingly, the SiCJFET 113 changes to an OFF state. When the Si-type MOSFET 114 is in an ON state, the potential $V_{DSM(ON)}$ of the drain Sj is set to 0.5V. In this way, the switching element SW1 comprised of the cascode connection is on/off controlled. When the SiCJFET 113 and the Si-type MOSFET 114 are comprised of separate chips (the semiconductor chip 110 and the semiconductor chip 111) as illustrated in FIG. 11, they are coupled with a bonding wire, for example. Therefore, the parasitic inductance L1 as depicted by the dashed line in FIG. 11 will be formed. The semiconductor chip 110, the semiconductor chip 111, and the parasitic inductance L1 are not illustrated in the drawing of Patent Literature 1. Because of the existence of the present parasitic inductance L1, a noise of about 20V is transitionally generated in the drain Sj due to the change of the drain current when the Si-type MOSFET 114 changes to an OFF state. Therefore, it is necessary to select a transistor with a sufficiently high withstand voltage (for example, the withstand voltage $BV_{DSS}$ of 30V) as the Si-type MOSFET 114. Although the Si-type MOSFET 114 and the SiCJFET 113 are both set in an OFF state, leakage currents IDSm and IDSj flow through the Si-type MOSFET 114 and the SiCJFET 113, respectively, even in the OFF state. When the leakage current IDSj which flows between the drain and the source of the SiCJFET 113 and the leakage current IDSm which flows between the drain and the source of the Si-type MOSFET 114 are balanced, the potential in the drain Sj of the Si-type MOSFET is maintained at about 5V. However, when the OFF-state leakage current IDSj of the SiCJFET 113 is larger than the OFF-state leakage current IDSm of the Si-type MOSFET 114, charges which flow into the Si-type MOSFET 114 cause the potential of the drain Sj to rise continuously, as illustrated in the waveform (D) of FIG. 11. When the potential of the drain Sj of the Si-type MOSFET 114 rises, the potential of the gate of the SiCJFET 113 becomes more negative relative to that of the source. Therefore, the leakage current IDSj becomes small. However, even in this period, the potential of the drain Sj of the Si-type MOSFET 114 continues to rise. Therefore, there is a possibility that the withstand voltage $BV_{DSS}$ (for example, 30V) of the Si-type MOSFET 114 may be exceeded. When the potential of the drain Sj of the Si-type MOSFET 114 exceeds the withstand voltage $BV_{DSS}$, the Si-type MOSFET 114 may start an avalanche operation and large current may flow through it. As a result, there is a possibility that the loss in the switching element comprised of the cascode connection may increase. It is also considerable to employ a Si-type MOSFET of a high withstand voltage to configure the cascode connection. However, to make the withstand voltage high generally means to make the drift layer in the element thick, leading to the increase of the on-resistance of the Si-type MOSFET 114. Consequently, the on-resistance of the switching element may increase.

(2) Examination on Patent Literature 2

When a so-called inverter circuit is comprised of two switching elements disclosed by Patent Literature 2 for example, coupling them in series between power sources and taking out a signal from a coupling node, there arises a possibility that a JFET in the switching element coupled to the low potential side may malfunction (erroneous conduction) and a large short-circuit current may flow. This phenomenon is explained with reference to FIG. 12. A diagram (A) of FIG. 12 illustrates a circuit which has been prepared by the present inventors in order to examine the contents disclosed by Patent Literature 2. Waveforms (B)-(F) of FIG. 12 illustrate operating waveforms of the circuit illustrated in the diagram (A) of FIG. 12.

As illustrated in the diagram (A) of FIG. 12, a switching element SW2 comprises a drain terminal D, a source terminal S, gate terminals G0 and G1, a normally-on SiCJFET 123, and a Si-type MOSFET 124 which is coupled in cascade to the normally-on SiCJFET 123. A gate driving circuit 122 drives the SiCJFET 123 via the gate terminal G1, in response to an input signal IN1. A gate driving circuit 125 drives the Si-type MOSFET 124 via the gate terminal G0, in response to an input signal IN0. The gate driving circuit 122 supplies a ground potential VSSJ of the circuit or a negative potential VKK to a gate Gj of the SiCJFET 123 according to the input signal IN1 as illustrated in the waveform (C) of FIG. 12. On the other hand, the gate driving circuit 125 always supplies a high level (a positive potential VDD) to a gate Gm of the Si-type MOSFET 124 as illustrated in the waveform (D) of FIG. 12.

The switching element SW2 (also called a lower-arm switching element hereinafter) is coupled in series with a switching element (not shown, also called an upper-arm switching element hereinafter) of the same configuration as the switching element SW2, thereby composing the so-called inverter circuit. That is, the lower-arm switching element and the upper-arm switching element are coupled in series between the predetermined potentials. The switching element SW2 indicates the switching element coupled to the low potential side. Therefore, the drain terminal D of the lower-arm switching element is coupled to the source terminal of the upper-arm switching element, and the source terminal S of the lower-arm switching element is coupled to a low potential point (for example, the ground potential point of the circuit). In this inverter circuit, an output signal is taken out from the node of the upper-arm switching element and the lower-arm switching element, by activating exclusively the upper-arm switching element and the lower-arm switching element into an ON state.

Next, the following describes the case where the lower-arm switching element is set in an OFF state and the upper-arm switching element is set in an ON state, according to the input signals IN0 and IN1. The operating waveforms of the lower-arm switching element in the present state are illustrated in the waveforms (B)-(F) of FIG. 12.

The lower-arm switching element is set in an OFF state. Accordingly, as indicated in the waveform (B) of FIG. 12, a voltage VD between the source and the drain of the switching element SW2 rises near to the power supply voltage VCC (for example, 300V). At this time, assuming that Cgs (not shown) is a parasitic capacitance between the gate and the source of the SiCJFET 123 and Cgd (not shown) is a parasitic capacitance between the gate and the drain, and if a ratio Cgd/(Cgs+Cgd) is comparatively large, the potential at the gate Gj of the SiCJFET 123 rises like a potential VGj by the effect of capacity coupling as illustrated in the waveform (C) of FIG. 12.

The parasitic capacitance of SiCJFET is decided by the depletion layer width and the area produced between regions. For example, with reference to FIGS. 9A and 9B which are to be employed in describing the structure of the SiCJFET according to an embodiment, the narrowest depletion layer width is at the region between a gate and a source. This is because the impurity concentration of a P-type gate region and an N-type source region is comparatively intense compared with other semiconductor regions, and hence the depletion layer width becomes narrow. Consequently, the value of the parasitic capacitance Cgs between the gate and the source becomes large. On the other hand, the opposing area of a region forming a gate (gate electrode p+gate) and a drift layer DRIFTj is large and impurity concentration is low; however, the parasitic capacitance Cgd between the gate and the drain has a large value next to the parasitic capacitance Cgs. As for the parasitic capacitance Cds between the drain and the source, the entire drift layer sandwiched by the gate electrodes p+gate becomes a depletion layer and the depletion layer width becomes very broad; as a result, the parasitic capacitance Cds between the drain and the source tends to become small compared with the other parasitic capacitance. Accordingly, as described above, the capacity ratio Cgd/(Cgs+Cgd) of the parasitic capacitance in the SiCJFET becomes large compared with that of the general Si-type MOSFET. The following describes the parasitic capacitance of the Si-type MOSFET with reference to FIG. 10, which is to be employed in describing the structure of the Si-type MOSFET according to the embodiment as well. With reference to FIG. 10, the parasitic capacitance Cgs is given by the series coupling of a capacity Cox due to the oxide film Tox under a gate electrode GPm and the depletion layer capacitance Cdep; therefore, the parasitic capacitance Cgd between the gate and the drain becomes considerably smaller than the parasitic capacitance Cgs between the gate and the source. As a result, the value of the capacity ratio Cgd/(Cgs+Cgd) becomes smaller than that of the JFET. Therefore, the Si-type MOSFET is more resistant to generation of erroneous conduction. Although it will be described later, in FIG. 10, a symbol SPm refers to a source electrode and a symbol DRAINm refers to a drain electrode. The capacitance characteristics of the Si-type MOSFET is described in Non Patent Literature 1, for example. In Non Patent Literature 1, the input capacitance (symbol Ciss) indicates the sum of the parasitic capacitance Cgs and the parasitic capacitance Cgd, the output capacitance (symbol Coss) indicates the sum of the parasitic capacitance Cgd and the parasitic capacitance Cds, and a backward feed capacitance (symbol Crss) indicates the parasitic capacitance Cgd. Therefore, when Non Patent Literature 1 is referred to, the capacity value of the parasitic capacitance Cgs is given by the capacity value of the symbol Ciss minus the capacity value of the symbol Crss, the capacity value of the parasitic capacitance Cgd is given by the capacity value of the symbol Crss, and the capacity value of the parasitic capacitance Cds is given by the capacity value of the symbol Coss minus the capacity value of the symbol Crss. A symbol ID illustrated in the waveform (F) of FIG. 12 indicates the current between the drain and the source.

In addition to the relation of the capacity ratio described above, the normally-on SiCJFET has a threshold voltage as low as about −3V because of the element characteristic; therefore, the potential at the gate Gj may rise as illustrated in the waveform (C) of FIG. 12 (the potential VGj) and erroneously conduct the SiCJFET, and short-circuit current IDP may flow transitionally between the drain terminal D and the source terminal S, as illustrated in the waveform (F) of FIG. 12. It has been clarified that, in Patent Literature 2, when the switching element is used, the Si-type MOSFET is always held in an ON state in this way, accordingly, the short-circuit current IDP flows to the source terminal S of the switching element and causes a large loss. If the negative potential VKK (the potential applied to the gate Gj) at the time of standby of the SiCJFET is lowered, it may be possible to solve the issue of the short-circuit current. However, the potential difference between the gate and the drain of the SiCJFET increases in this case. Therefore, when a surge potential which exceeds the withstand voltage of the SiCJFET element at the time of switching is generated at the drain node of the lower-arm SiCJFET, it is plausible that the SiCJFET element itself is destroyed. In the diagram (A) of FIG. 12, a symbol 120 and a symbol 121 depicted by dashed lines indicate semiconductor chips in which the SiCJFET 123 and the Si-type MOSFET 124 are formed, respectively. When the switching element SW2 is comprised of the semiconductor chip 120 and the semiconductor chip 121 as illustrated in FIG. 12, they are coupled by a bonding wire as is the case with FIG. 11. Therefore, the parasitic inductance L2 as depicted by the dashed line in FIG. 12 will be formed. The semiconductor chip 120, the semiconductor chip 124, and the parasitic inductance L2 are not illustrated in the drawing of Patent Literature 2.

The other issues and new features of the present invention will become clear from the description of the present specification and the accompanying drawings.

A semiconductor device according to one embodiment comprises a normally-off silicon transistor and a normally-on compound transistor, which are mutually coupled in cascode. The silicon transistor and the compound transistor are driven by one input signal, so as to have a period in which both transistors are set in an OFF state.

According to the one embodiment, it becomes possible to reduce the possibility that the semiconductor device is destroyed.

BRIEF DESCRIPTION OF THE DRAWINGS

FIG. 1 is a drawing illustrating a circuit diagram of a semiconductor device according to an embodiment;

FIGS. 2A, 2B and 2C are drawings illustrating operating waveforms of the semiconductor device according to the embodiment;

FIGS. 4A, 4B, 4C, 4D and 4E are drawings illustrating operating waveforms of the system according to the embodiment;

FIG. 9A and FIG. 9B are drawings illustrating sectional views of the structure of the SiCJFET according to the embodiment;

FIGS. 11A, 11B, 11C and 11D are drawings illustrating an examination performed by the present inventors;

FIGS. 12A, 12B, 12C, 12D, 12E and 12F are drawings illustrating an examination performed by the present inventors.

DETAILED DESCRIPTION

Figure 3:
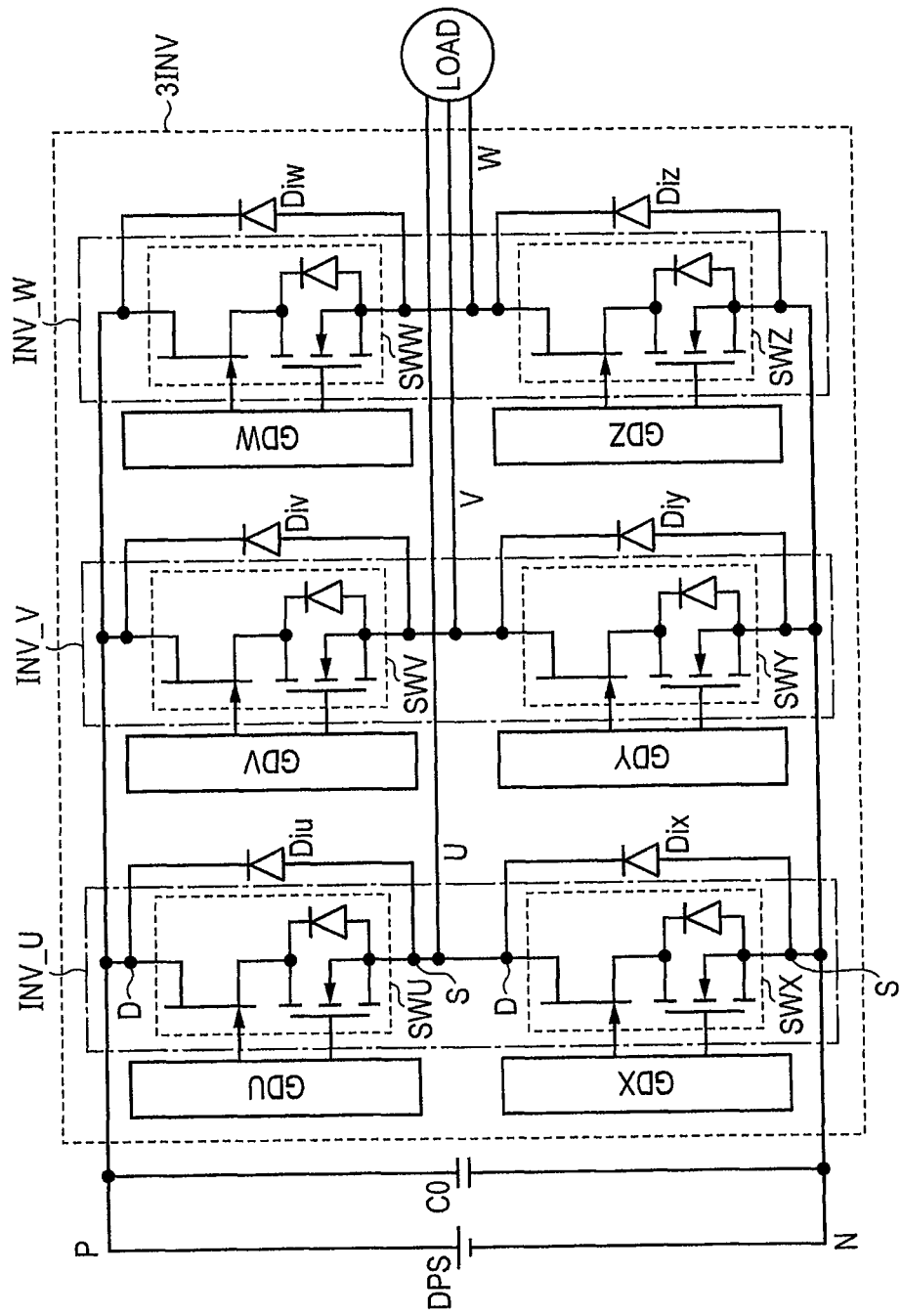
FIG. 3 is a drawing illustrating a block diagram of a system according to the embodiment.

In the following description, the same reference symbol is attached to a portion which has the identical function, and the detailed explanation thereof is omitted. In the case where the description is omitted, it is advised to refer to the description of the corresponding portion to which the same symbol is attached.

Here, the description method in the present specification is explained. A JFET and a MOSFET are transistors which have a gate, a source, and a drain. A transistor in which current flows through a path between a source and a drain (a source-to-drain path) of the transistor when the gate and the source are substantially set at the same potential is called a normally-on transistor in the present specification. A transistor in which current does not flow substantially through the source-to-drain path when the gate and the source are substantially set at the same potential is called a normally-off transistor in the present specification. It can be also interpreted such that a normally-on transistor is a depletion-type transistor and a normally-off transistor is an enhancement-type transistor. In order to distinguish a transistor made from silicon and a transistor made from compound semiconductor, in the present specification, a transistor which employs silicon is called a Si-type MOSFET, a Si-type JFET, or a silicon transistor. Similarly, a transistor made from the compound semiconductor is expressed by appending a material name before MOSFET and JFET. For example, when SiC is employed as a material, it is described as a SiCJFET. When material of the compound semiconductor is not specified in particular, it is described as a compound transistor and a compound JFET.

An "inverter" is roughly classified into the following three meanings. In the present specification, the term is properly used as follows for convenience, according to the three meanings. (1) An inverter device: a power supply circuit which generates ac power electrically from direct current power or a power conversion device provided with the power supply circuit. (2) An inverter circuit: a circuit which configures a part of the power supply circuit of (1) described above, and in which two switching elements are coupled in series between power sources and a signal is taken out from the node. (3) An inverter: a logical NOT gate as a kind of logic circuit.

<<Outline of Embodiment>>

First, the outline of the embodiment is described with reference to FIGS. 1 and 2 which will be described in detail later. FIG. 1 illustrates a circuit diagram of a semiconductor device, and FIG. 2 illustrates operating waveforms of the circuit illustrated in FIG. 1.

As illustrated in FIG. 1, the semiconductor device SW includes two semiconductor chips 1 and 2 surrounded with a dashed line, respectively. A normally-on SiCJFET (compound transistor) 3 is formed in the semiconductor chip 1, and a normally-off Si-type MOSFET (silicon transistor) 4 is formed in the semiconductor chip 2. The semiconductor device SW is provided with a terminal S and a terminal D in a pair, and the SiCJFET 3 and the Si-type MOSFET 4 are coupled in series between the terminal D and the terminal S (coupled in cascode). That is, a source of the SiCJFET 3 is coupled to a drain of the Si-type MOSFET 4. Accordingly, a source-to-drain path of the SiCJFET 3 is coupled between the terminal S and the terminal D via a source-to-drain path of the Si-type MOSFET 4. In FIG. 1, a drive circuit GD is a circuit for driving the semiconductor device SW, and includes gate driving circuits 5 and 6. Input signals IN1 and IN0 are supplied to the gate driving circuits 5 and 6, respectively, and the SiCJFET 3 and the Si-type MOSFET 4 are driven by signals supplied from the gate driving circuits 5 and 6. As will be understood from the following description, the input signal IN1 and the input signal IN0 are correlating with each other and they are generated on the basis of one input signal IN. According to the input signal IN, the SiCJFET 3 and the Si-type MOSFET 4 are turned on and off; thereby the semiconductor device SW operates as a switching circuit. That is, one input signal IN is an input signal which controls ON and OFF of the switching circuit. In FIG. 1, a coil depicted with a dashed line indicates a parasitic inductance Lj of a wiring which couples the SiCJFET 3 with the Si-type MOSFET 4. Hereinafter, the semiconductor device SW is also called a switching circuit SW.

FIG. 2 illustrates the operating waveforms of the semiconductor device SW. A waveform (A) of FIG. 2 illustrates the waveform of a signal supplied to the gate Gj of the SiCJFET 3, and a waveform (B) illustrates the waveform of a signal supplied to the gate Gm of the Si-type MOSFET 4. The high level of the signal supplied to the gate Gj of the SiCJFET 3 is a ground potential and the low level is a negative potential. On the other hand, the high level of the signal supplied to the gate Gm of the Si-type MOSFET 4 is a positive potential and the low level is the ground potential.

When setting the switching circuit SW into an OFF state according to the input signal IN, the gate driving circuit 5 supplies the negative potential VKK to the gate Gj, and the gate driving circuit 6 supplies the ground potential VSSM to the gate Gm, in response to the input signal IN1 and the input signal IN0 which are generated on the basis of the input signal IN. Accordingly, the SiCJFET 3 and the Si-type MOSFET 4 are set in an OFF state, and it becomes possible to enhance the reduction of a leakage current of the switching circuit SW.

When setting the switching circuit SW into an ON state according to the input signal IN, it is desirable to set as a high level the signal supplied to the gate Gm of the Si-type MOSFET 4 earlier than the signal supplied to the gate Gj of the SiCJFET 3, as illustrated in the waveforms (A) and (B) of FIG. 2. By this setting, it becomes possible to reduce a surge potential which is generated by the parasitic inductance Lj.

Next, when setting the switching circuit SW into an OFF state according to the input signal IN, it is desirable to set as a low level (the negative potential) the signal supplied to the gate Gj of the SiCJFET 3 earlier than the signal supplied to the gate Gm of the Si-type MOSFET 4, as illustrated in the waveforms (A) and (B) of FIG. 2. By this setting, it becomes possible to suppress a surge potential which is generated by the parasitic inductance Lj.

Accordingly, it is possible to enhance the reduction of the leakage current of the switching circuit (the semiconductor device). It becomes also possible to reduce a possibility that the switching circuit is destroyed by the surge potential.

Embodiment

1. A Switching Circuit

As illustrated in FIG. 1, the semiconductor device SW includes two semiconductor chips 1 and 2. The normally-on SiCJFET 3 is formed in the semiconductor chip 1, and the normally-off Si-type MOSFET 4 is formed in the semiconductor chip 2. The SiCJFET 3 and the Si-type MOSFET 4 are coupled in cascade between the terminal D and the terminal S which are provided in the semiconductor device SW. That is, the source-to-drain path of the SiCJFET 3 and the source-to-drain path of the Si-type MOSFET 4 are coupled in series between the terminal S and the terminal D. A signal from the drive circuit GD is supplied to the semiconductor device SW. In the drive circuit GD, the gate driving circuits 5 and 6 receive signals IN1 and IN0 changing according to the input signal IN, and supply the signals changing according to the input signal IN to the terminals G1 and G0 of the semiconductor device SW. The terminal G1 is coupled to the gate Gj, and the terminal G0 is coupled to the gate Gm. The SiCJFET 3 and the Si-type MOSFET 4 turn on and off according to the potential of the input signal IN. That is, the semiconductor device SW operates as a switching circuit which makes a path between the terminal S and the terminal D conductive or non-conductive according to the input signal IN (hereinafter, the semiconductor device SW is also called a switching circuit SW). In the present embodiment, the terminal S is a source of the switching circuit SW, and the terminal D is a drain of the switching circuit SW. However, it should be noted that the expression of a source and a drain changes depending on the direction of the current supplied to the switching circuit SW. The source electrode Sj of the SiCJFET 3 is coupled to the drain electrode of the Si-type MOSFET 4; accordingly, the source electrode Sj of the SiCJFET 3 may indicate the drain electrode of the Si-type MOSFET 4.

FIG. 2 illustrates the driving waveforms of the semiconductor device SW illustrated in FIG. 1. When making the path between the source S and the drain D of the switching circuit SW non-conductive, the negative potential VKK (for example, −20V) is applied to the gate Gj of the SiCJFET 3, according to the input signal IN. At this time, the potential VSSM equal to the ground level (for example, 0V) is applied to the gate Gm of the Si-type MOSFET 4 according to the input signal IN. Accordingly, the SiCJFET 3 and the Si-type MOSFET 4 are both set into an OFF state. Next, when making the path between the source S and the drain D of the switching circuit SW conductive, the potential of the gate Gm of the Si-type MOSFET 4 is set to the positive potential VDD (for example, 15V) from the ground potential VSSM according to the input signal IN, and the Si-type MOSFET 4 is set into an ON state. After a predetermined time tdA, the potential of the gate Gj of the SiCJFET 3 is shifted from the negative potential VKK to the potential VSSJ (for example, 0V) equal to the ground potential according to the input signal IN, and the SiCJFET 3 is set into an ON state. At this point, if the SiCJFET 3 is set to an ON state earlier than the Si-type MOSFET 4, a surge potential may be generated by the parasitic inductance Lj which exists in the source of the SiCJFET 3, and the drain potential of the Si-type MOSFET 4 may rise higher than the withstand voltage. Therefore, in the present embodiment, the Si-type MOSFET 4 is driven earlier than the SiCJFET 3, and the source S of the switching circuit SW and the source Sj of the SiCJFET 3 is electrically coupled. Accordingly, it becomes possible to suppress a noise due to a surge. The SiCJFET 3 and the Si-type MOSFET 4, which are coupled in cascode, are both set in an ON state according to the input signal IN, thereby the switching circuit SW is set in an ON state, and the switching circuit SW is set in the conductive state. The potential of the source electrode Sj of the SiCJFET 3 at this time becomes equal to an ON state voltage of the Si-type MOSFET 4, that is, about 0.5V, for example.

Next, the following describes the operation of turning off the switching circuit SW according to the input signal IN. First, the potential of the gate Gj of the SiCJFET 3 is shifted from the ground potential VSSJ to the negative potential VKK. Next, after the desired delay time tdB, the potential of the gate Gm of the Si-type MOSFET 4 is shifted from the positive potential VDD to the ground potential VSSM. Accordingly, the SiCJFET 3 and the Si-type MOSFET 4 are both set in an OFF state and the cascade switching element (the semiconductor device or the switching circuit) SW is set in an OFF state. In the present embodiment, the SiCJFET 3 is set in an OFF state prior to the Si-type MOSFET 4. Accordingly, it is possible to suppress the generation of a surge potential at the source electrode Sj of the SiCJFET 3. Consequently, when turning off the switching circuit SW, it is desirable to drive the SiCJFET 3 in advance. By applying the driving as illustrated in FIG. 2, the OFF state voltage at the time of the standby when the SiCJFET 3 is in an OFF state becomes the negative potential VKK (for example, −20V). Therefore, it is possible to reduce the leakage current IDSj which is generated in the SiCJFET 3 immediately after the SiCJFET 3 is set into an OFF state. Consequently, even if the leakage current IDSj of the SiCJFET 3 at this time is larger than the leakage current IDS of the Si-type MOSFET 4 at this time and the potential of the source electrode Sj of the SiCJFET 3 rises as the result, the voltage which is a difference of the risen amount of potential dVSj (for example, 20V) and the potential of the gate Gj of the SiCJFET 3 (the negative potential VKK) is applied between the gate and the source of the SiCJFET 3. According to the example, the voltage of "the negative potential VKK−the potential dVSj=−40V" is applied between the gate and the source of the SiCJFET 3. Accordingly, it becomes possible to fully reduce the leakage current IDSj which is generated in the SiCJFET 3. As a result of reducing the leakage current IDSj, it is possible to lengthen enough the time required for the potential in the drain of the Si-type MOSFET 4 to rise. Thereby, the potential rise at the drain Sj of the Si-type MOSFET 4 is suppressed low, in the cycle of the frequency at which the switching circuit SW switches (switching frequency). Therefore, it is possible to prevent the avalanche operation in the Si-type MOSFET as described above. In other words, the rise of the drain potential of the Si-type MOSFET 4 is suppressed; therefore, it is not necessary to design the withstand voltage of the Si-type MOSFET 4 unduly high. That is, since element structure which has a comparatively low withstand voltage can be adopted, it becomes possible to reduce the on-resistance of the Si-type MOSFET 4 and to reduce the loss of the switching element (switching circuit). Here, the element structure which has a comparatively low withstand voltage means the structure in which the film thickness is reduced or the concentration is increased, in the drift layer DRIFTm illustrated in FIG. 10, for example.

The configuration for providing the desired delay times tdA and tdB in the above is not described here, because one example of the configuration will be described later with reference to FIGS. 5 and 6. In FIG. 1, the diode coupled between the source and the drain of the Si-type MOSFET 4 indicates a parasitic diode. The same holds true for other figures (for example, FIG. 3).

2. An Inverter Circuit and a System Using the Same

Next, the following describes an example in which the semiconductor device SW and the drive circuit GD described with reference to FIG. 1 are applied to a system. Here, as an example of the application, a system of a motor driven by a three-phase inverter circuit is described.

FIG. 3 illustrates a block diagram of a system SYS of a three-phase inverter circuit 3INV which drives a three-phase motor LOAD according to an input signal. Each of switching circuits SWU, SWV, SWW, SWX, SWY, and SWZ has the same configuration as the semiconductor device SW illustrated in FIG. 1. The drive circuit GD provided pertaining to the semiconductor device SW is illustrated as drive circuits GDU, GDV, GDW, GDX, GDY, and GDZ in FIG. 3. That is, the three-phase inverter circuit 3INV has the semiconductor device and the pertaining drive circuit which are illustrated in FIG. 1 in groups of six. In order to configure an inverter circuit, two semiconductor devices (a first semiconductor device and a second semiconductor device) each operating as a switching circuit are coupled in series between a plus side P and a negative side N of a DC power supply DPS, and the two semiconductor devices coupled in series perform a complementary switching operation with each other according to an input signal. The power supply voltage which is a potential difference of the potential VCC of the plus side P and the ground potential of the negative side N of the DC power supply DPS is 300V, for example. By the complementary switching operation, a driving signal is outputted from a node of the two semiconductor devices to the motor as a load device. In the example illustrated in FIG. 3, the semiconductor device SWU and the semiconductor device SWX are coupled in series to configure an inverter circuit INV_U, and a signal is outputted from the node to drive a U phase of the three-phase motor LOAD as the load device. Similarly, the semiconductor device SWW and the semiconductor device SWY are coupled in series to configure an inverter circuit INV_V, and a signal is outputted from the node to drive a V phase of the three-phase motor LOAD as the load device. The semiconductor device SWW and the semiconductor device SWZ are coupled in series to configure an inverter circuit INV_W, and a signal is outputted from the node to drive a W phase of the three-phase motor LOAD as the load device. In FIG. 3, reflux diodes Diu, Div, Diw, Dix, Diy, and Diz are coupled respectively between a terminal S and a terminal D of the semiconductor devices SWU, SWV, SWW, SWX, SWY, and SWZ. A capacitor C0 is coupled between the plus side P and the negative side N of the DC power supply DPS.

FIG. 4 illustrates operating waveforms of the three-phase inverter circuit 3INV illustrated in FIG. 3. Since each phase performs the same operation, FIG. 4 illustrates only the operating waveform of the inverter circuit INV_U which generates the driving signal to drive the U phase of the three-phase motor LOAD. In the following description, among the two semiconductor devices and two drive circuits which configure an inverter circuit, the semiconductor device SWU coupled to the plus side P of the DC power supply DPS and the pertaining drive circuit GDU are called an upper arm, and the semiconductor device SWX coupled to the negative side N of the DC power supply DPS and the pertaining drive circuit GDX are called a lower arm.

With reference to FIG. 4, the following describes the operation of the three-phase inverter circuit 3INV illustrated in FIG. 3, taking the U phase as an example. The waveforms (A)-(E) of FIG. 4 are operating waveforms of the lower arm. Since it is an inverter circuit, the switching circuit (the semiconductor device) SWU of the upper arm and the switching circuit (the semiconductor device) SWX of the lower arm operate complementarily according to an input signal. For example, the control is performed by the input signal such that, when the lower-arm switching circuit SWX is in an OFF state, the upper-arm switching circuit SWU shifts to an ON state. FIG. 4 illustrates the state where, up to time t, the lower-arm switching circuit SWX is in an ON state and the upper-arm switching circuit SWU is in an OFF state. At time t, the lower-arm switching circuit SWX is set to an OFF state, and the upper-arm switching circuit SWU shifts to an ON state. In order that the switching circuit SWU can shift to an ON state, the potential VD at the terminal D of the lower-arm switching circuit SWX rises to near the potential VCC of the power supply voltage. Thereby, the potential at the drain of the SiCJFET (corresponding to the SiCJFET 3 illustrated in FIG. 1) of the switching circuits SWX rises rapidly. As previously described with reference to FIG. 12, the potential at the gate Gj of the SiCJFET also rises transitionally with the rise of the potential at the drain of the SiCJFET. As a result, a charge flows in from the drain of the SiCJFET, and although it is temporary, the potential of the drain Sj of the Si-type MOSFET (corresponding to the Si-type MOSFET 4 illustrated in FIG. 1) rises. Here, in the circuit illustrated in FIG. 12, the Si-type MOSFET is in an ON state at this time, therefore, the short-circuit current will flow into the terminal S of the switching circuit SWX. However, according to the present embodiment, the potential at the gate Gm is set to a low level, therefore, the Si-type MOSFET is set to an OFF state at this time. For that reason, the short-circuit current does not flow to the terminal S of the switching circuit SWX, in other words, it is possible to reduce the loss of the switching circuit. The potential at the drain Sj of the Si-type MOSFET rises due to the inflow of a charge, as described above, however, by suitably and temporarily turning on the switching circuits SWU and SWX one by one when the upper-arm switching circuit SWU and the lower-arm switching circuit SWX of the U phase are both in an OFF state, the charge stored in the drain of the Si-type MOSFET can be extracted to the terminal S, and the potential at the drain of the Si-type MOSFET can be reduced.

In FIG. 4, the operating waveforms (B)-(D) before time t are the same as the operating waveforms (A)-(C) illustrated in FIG. 2 described above, therefore, the description thereof is omitted here.

Figure 5:
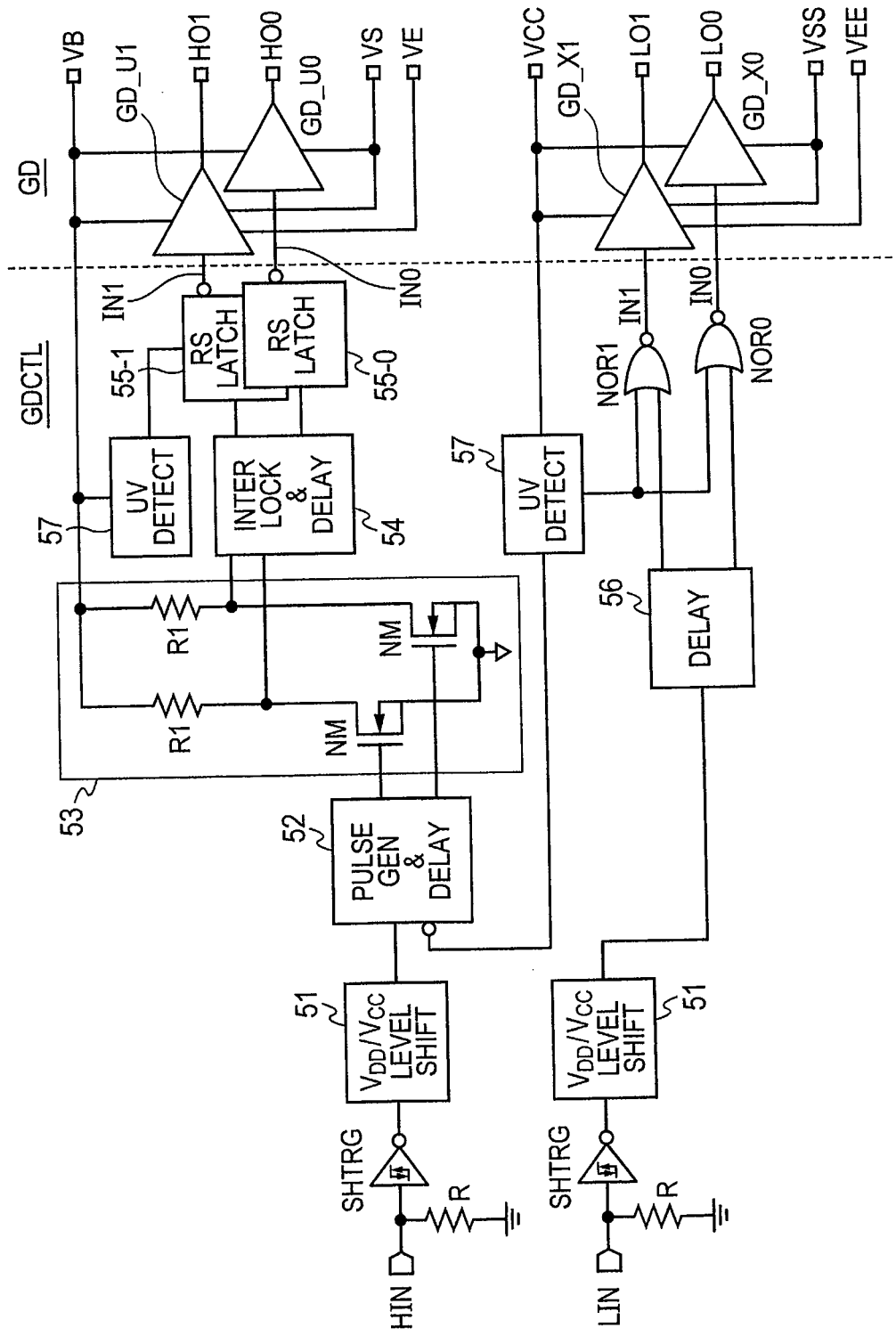
FIG. 5 is a drawing illustrating a block diagram of a control circuit and a drive circuit employed in the system according to the embodiment.

FIG. 5 illustrates a block diagram of a gate-driver control circuit GDCTL and a drive circuit GD for generating the waveforms illustrated in FIGS. 2 and 4. In FIG. 5, the portion illustrated on the right-hand side of a dashed line is the drive circuit GD, and the portion illustrated on the left-hand side of the dashed line is the gate-driver control circuit GDCTL. The gate-driver control circuit GDCTL and the drive circuit GD which correspond to one inverter circuit are illustrated in the figure. Consequently, when driving the three-phase motor LOAD illustrated in FIG. 3, three groups of the configurations illustrated in FIG. 5 are employed. Here, an example of driving the U phase of FIG. 3 among three phases is described. That is, FIG. 5 illustrates a gate-driver control circuit GDCTL and a drive circuit GD which correspond to the inverter circuit INV_U (the switching circuit SWU and the switching circuit SWX) for driving the U phase illustrated in FIG. 3. The drive circuits GDU and GDX are illustrated also in FIG. 3, and the correspondence between FIG. 3 and FIG. 5 should be understood as follows: that is, the gate driving circuits GD_U0 and GD_U1 included in the drive circuit GD (FIG. 5) correspond to the gate driving circuits included in the drive circuit GDU of FIG. 3, and the gate driving circuits GD_X0 and GD_X1 correspond to the gate driving circuits included in the gate driving circuit GDX of FIG. 3. In FIG. 3, in order to avoid the drawing from becoming complicated, the input signals of each gate driving circuit are not shown.

First, the gate-driver control circuit GDCTL is described. The gate-driver control circuit GDCLT receives input signals for each semiconductor device (switching circuit) to control. In FIG. 5, an input signal HIN for controlling the switching circuit SWU and an input signal LIN for controlling the switching circuit SWX are supplied to the gate-driver control circuit GDCTL. The gate-driver control circuit GDCTL generates input signals IN0 and IN1 according to the input signal HIN (the input signal LIN) and supplies them to the gate driving circuits GD_U0 and GD_U1 (the gate driving circuits GD_X0 and GD_X1). Accordingly, the switching circuit SWU (the switching circuit SWX) is driven according to the input signal HIN (the input signal LIN). When driving the three-phase inverter circuit 3INV illustrated in FIG. 3, since the upper arm and the lower arm are different in voltage to process therein, the voltage supplied to the circuit which processes the input signal HIN and the voltage supplied to the circuit which processes the input signal LIN are different, in the gate-driver control circuit GDCTL and the gate driving circuit GD, illustrated in FIG. 5. In FIG. 5, as for the power supply potential to be supplied to blocks and others which do not indicate the power supply potential, it is sufficient to select the power supply potential depending on the potential of the signal to be processed in each of the blocks and others.

The input signal MIN supplied to the gate-driver control circuit GDCTL is supplied to a level conversion circuit ($V_{DD}/V_{CC}$ LEVEL SHIFT) 51 via a Schmitt trigger circuit SHTRG. By employing the Schmitt trigger circuit SHTRG and a resistor R, it is possible to supply an output signal of a stabilized level to a level conversion circuit 51 even when the input signal HIN fluctuates. An output signal of the level conversion circuit 51 is supplied to a pulse generator/delay circuit (PULSE GEN & DELAY) 52, and an output signal of the latter is supplied to a level shift circuit 53. The level shift circuit 53 is comprised of a Si-type MOSFET (NM) and a resistor R1. An output signal of the level shift circuit 53 is supplied to RS latch circuits (RS LATCH) 55-0 and 55-1 via an interlock circuit/delay circuit (INTERLOCK & DELAY) 54. Output signals of the RS latch circuits 55-0 and 55-1 are supplied to the gate driving circuits GD_U0 and GD_U1. The input signal LIN is supplied to a level shift circuit 51 via a Schmitt trigger circuit SHTRG. An output signal of the level shift circuit 51 is supplied to NOR gates NOR0 and NOR1 via a delay circuit (DELAY) 56, and output signals of the NOR gates NOR0 and NOR1 are supplied as the input signals IN0 and IN1 to the gate driving circuits GD_X0 and GD_X1. As is the case with the input signal HIN, by employing the Schmitt trigger circuit SHTRG and the resistor Rin the input stage, it is possible to supply an output signal of a stabilized level to the delay circuit 56.

In FIG. 5, a source voltage drop protection circuit (UV DETECT) 57 deactivates the gate driving circuit when the power supply voltage drops, and prevents the switching element from being destroyed.

The gate driving circuits GD_U0 and GD_U1 drive the upper-arm switching circuit SWU by the signals from output terminals HO0 and HO1. In order to generate a drive voltage for driving, the gate driving circuits GD_U0 and GD_U1 are supplied with, as the operation potentials, a positive potential VB on the high potential side, a ground potential VS of the circuit, and a negative potential VE on the high potential side. Here, the negative potential VE is generated on the basis of the ground potential VS for the circuit. In response to the signal IN1 from the RS latch circuit 55-1 as an input signal, the gate driving circuit GD_U1 supplies a driving signal to the gate of the SiCJFET in the switching circuit SWU (corresponding to the SiCJFET 3 illustrated in FIG. 1). On the other hand, in response to the signal IN0 from the RS latch circuit 55-0 as an input signal, the gate driving circuit GD_U0 supplies a driving signal to the gate of the Si-type MOSFET in the switching circuit SWU (corresponding to the Si-type MOSFET 4 illustrated in FIG. 1).

The gate driving circuits GD_X0 and GD_X1 drive the lower-arm switching circuit SWX with signals from the output terminals LO0 and LO1. In order to generate a drive voltage for driving, the gate driving circuits GD_X0 and GD_X1 are supplied with, as the operation potentials, a positive potential VCC on the low potential side, a ground potential VSS of the circuit, and a negative potential VEE on the low potential side. Here, the negative potential VEE is generated on the basis of the ground potential VSS for the circuit. In response to the signal IN1 from the NOR gate NOR1 as an input signal, the gate driving circuit GD_X1 supplies a driving signal to the gate of the SiCJFET in the switching circuit SWX (corresponding to the SiCJFET 3 illustrated in FIG. 1). On the other hand, in response to the signal IN0 from the NOR gate NOR0 as an input signal, the gate driving circuit GD_X0 supplies a driving signal to the gate of the Si-type MOSFET in the switching circuit SWX (corresponding to the Si-type MOSFET 4 illustrated in FIG. 1). Although not restricted in particular, the negative potentials VE and VEE are generated by a voltage regulator (not shown).

Next, operation of the gate-driver control circuit GDCTL illustrated in FIG. 5 is described. When the input signal LIN is asserted, a high level potential of the input signal LIN is converted into a positive potential VCC which is the high level potential of the gate driving circuits GD_X0 and GD_X1, by the level conversion circuit 51. The level-converted signal is supplied to the gate driving circuits GD_X0 and GD_X1 as the input signals IN0 and IN1 via the delay circuit 56 and the NOR gates NOR0 and NOR1. Thereby, the gate driving circuits GD_X0 and GD_X1 drive the gates Gj and Gm with the driving signals illustrated in the waveforms (A) and (B) of FIG. 2 and the waveforms (B) and (C) of FIG. 4, according to one input signal LIN. Similarly, the input signal HIN is converted in level in the level conversion circuit 51, and converted into a timing signal with desired timing by the pulse generator/delay circuit 52. That is, in response to the input signal HIN, a pulse generator included in the pulse generator/delay circuit 52 outputs the timing signal which specifies the rising and falling of the output signal in the upper arm. The timing signal generated by the pulse generator/delay circuit 52 is supplied to the interlock circuit/delay circuit 54 via the level conversion circuit 53, and is supplied to the RS latch circuits 55-0 and 55-1. When unfixed signals other than the regular input signal are inputted, an interlock circuit included in the interlock circuit/delay circuit 54 controls not to transfer the signal to the latter RS latch circuits 55-0 and 55-1 and not to assert the output signal in the upper arm. The signal from the RS latch circuits 55-1 and 55-0 are supplied to the gate driving circuits GD_U1 and GD_U0 as the input signals IN1 and IN0, and the driving signals illustrated in the waveforms (A) and (B) of FIG. 2 and the waveforms (B) and (C) of FIG. 4 are outputted from the gate driving circuit GD_U1 and GD_U0 to the gates Gj and Gm. However, since the gate driving circuits GD_U1 and GD_U0 correspond to the upper arm, the potential of each of the signals which drive the gates Gj and Gm is the potential corresponding to the upper arm. In this way, the driving signals for driving separately the SiCJFET and the Si-type MOSFET which configure the switching circuit SW are generated by the gate-driver control circuit GDCTL and the gate driving circuit GD, on the basis of one input signal (for example, the input signal LIN).

Figure 6:
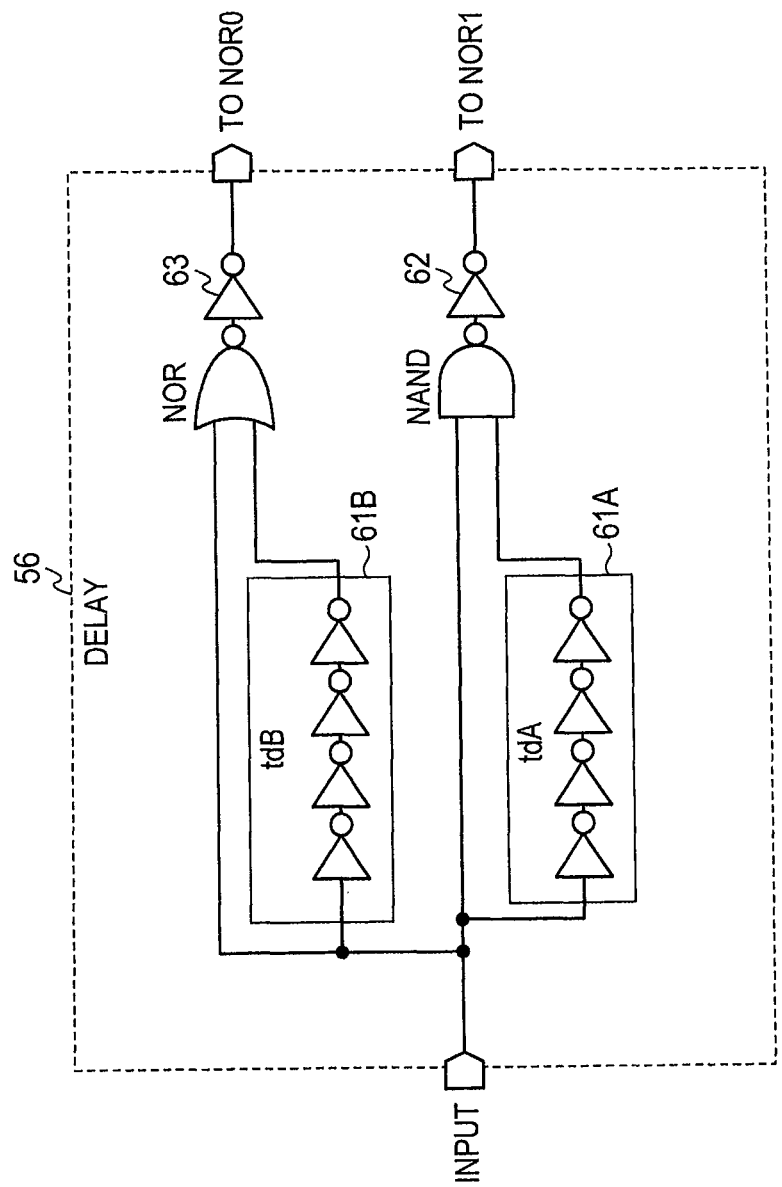
FIG. 6 is a drawing illustrating a block diagram of a delay circuit employed in the system according to the embodiment.

FIG. 6 illustrates an example of the delay circuit for generating the delay time tdA and the delay time tdB described above. Here, the explanation is made about an example of a delay circuit to be applied to the delay circuit 56 corresponding to the lower arm illustrated in FIG. 5. In FIG. 6, an input signal Input to the delay circuit 56 corresponds to the signal supplied via the level conversion circuit 51 illustrated in FIG. 5. When the input signal Input is asserted to a high level, the NOR gate NOR outputs a low level and it is inputted into the inverter 63. The inverter 63 outputs to the NOR gate NOR0 in the latter stage (refer to FIG. 5) a high level which is an inverted signal of the output signal of the NOR gate NOR, and asserts the gate of the Si-type MOSFET (corresponding to the Si-type MOSFET 4 illustrated in FIG. 1, and also called the Si-type MOSFET 4 in the present paragraph). After that, a signal which is delayed by the delay time tdA by the delay circuit 61A comprised of the plural inverters is inputted into the NAND gate NAND. Accordingly, the NAND gate NAND outputs a low level and it is inputted into the inverter 62. The inverter 62 outputs to the NOR gate NOR1 of the latter stage (refer to FIG. 5) a low-level signal which is an inverted signal of the output signal of the NAND gate NAND, and asserts the gate of the SiCJFET (corresponding to the SiCJFET 3 illustrated in FIG. 1 and also called the SiCJFET 3 in the present paragraph) after the delay time tdA. When turning off the switching circuit SW, the delay time tdB of the delay circuit 61B comprised of plural inverters is utilized. By asserting the input signal to a low level, the SiCJFET 3 is set to an OFF state in advance, the NOR gate NOR outputs a high level after the delay time tdB, and the inverted signal propagates to the gate of the Si-type MOSFET 4, setting the Si-type MOSFET 4 into an OFF state. When the delay circuit 56 operating as described above is employed, it is possible to freely control the driving time of the SiCJFET 3 and the Si-type MOSFET 4. It is needless to say that the length of the delay time can be changed by increasing or decreasing the number of stages of the inverters in the delay circuits 61A and 61B. When the gate-driver control circuit GDCTL is configured by employing such a circuit, it becomes possible to generate the waveforms illustrated in FIGS. 2 and 4 and to reduce a loss in the switching circuit.

Each block illustrated in FIGS. 5 and 6 can be realized by combining a well-known logic circuit and a sequential circuit; therefore, description of the circuit configuration of each block is omitted. What is necessary is just to enable it to generate the driving signals of the gates Gj and Gm illustrated in FIGS. 1 and 4 on the basis of one input signal, therefore, the configuration illustrated in FIGS. 5 and 6 is merely an example.

The gate-driver control circuit GDCTL and the drive circuit GD illustrated in FIG. 5 may be formed in one semiconductor chip, or may be formed separately in different semiconductor chips. The switching circuit SW and the gate-driver control circuit GDCTL may also be formed in the same semiconductor chip. Furthermore, the switching circuit SW, the gate-driver control circuit GDCTL, and the drive circuit GD may be formed in the same semiconductor chip.

As for the negative potentials VE and VEE to be supplied to the upper arm and the lower arm, by providing a regulator in the exterior of the semiconductor chip, the potential generated by the regulator may be supplied to the drive circuit. Naturally, the negative power regulator may be built in a semiconductor chip, together with the gate-driver control circuit GDCTL and the drive circuit GD. In this way, it is possible to realize the drive circuit according to the present embodiment by adding the minimum necessary circuits, such as the delay circuit 56, to the configuration of the general-purpose semiconductor integrated circuit for a drive circuit. Therefore, it is possible to reduce the additional cost for realizing the drive circuit.

Figure 13:
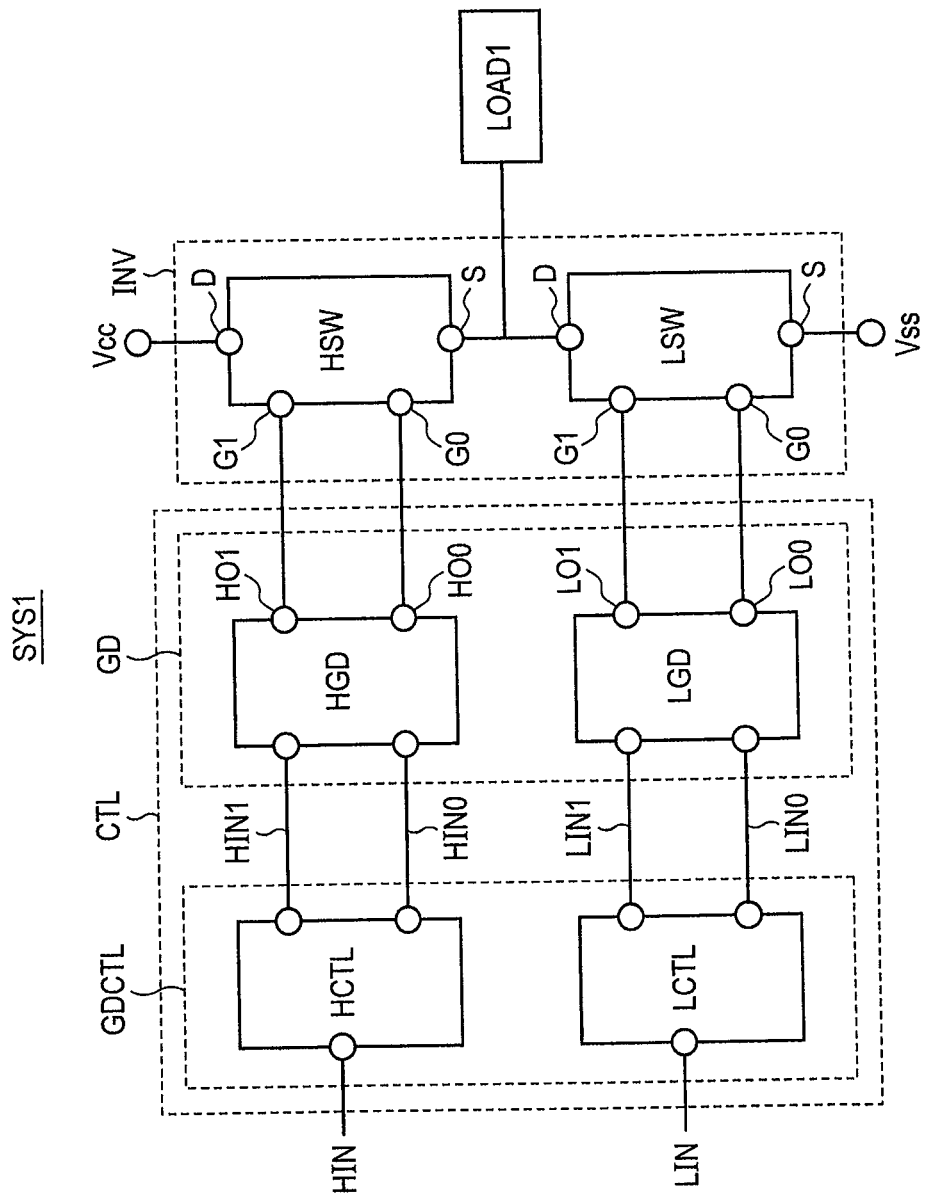
FIG. 13 is a drawing illustrating a block diagram of the system according to the embodiment.

The example in which the semiconductor device according to the present embodiment is applied to the three-phase inverter circuit is illustrated in FIG. 3. However, it is also possible to apply the semiconductor device according to the present embodiment to a system in which the load device is a coil for example and the load device is driven by one inverter circuit. In this case, as illustrated in FIG. 13, the system SYS1 comprises a load device LOAD1, such as a coil, an inverter circuit INV for driving the load device LOAD1, and a control circuit CTL for controlling the inverter circuit INV. It should be understood as follows: that is, the inverter circuit INV has the same configuration as the inverter circuit INV_U corresponding to the U phase, as described with respect to FIG. 3, and the control circuit CTL comprises the gate-driver control circuit GDCTL and the drive circuit GD, as described with reference to FIGS. 5 and 6. Here, the switching circuit (the first semiconductor device) HSW and the switching circuit (the second semiconductor device) LSW have the same configuration as the switching circuit (the semiconductor device) SW illustrated in FIG. 1. The drive circuit HGD comprises the gate driving circuits GD_U1 and GD_U0 illustrated in FIG. 5, and the drive circuit LGD comprises the gate driving circuits GD_X1 and GD_X0 illustrated in FIG. 5. The gate-driver control circuit LCTL corresponds to the lower half of the block diagram of the gate-driver control circuit GDCTL illustrated in FIG. 5, and comprises the Schmitt trigger circuit SHTG, the resistor R, the level conversion circuit 51, the delay circuit 56, the source voltage drop protection circuit 57, and the NOR gates NOR0 and NOR1. The gate-driver control circuit HCTL corresponds to the upper half of the block diagram of the gate-driver control circuit GDCTL illustrated in FIG. 5, and comprises circuits other than the circuits which are included in the lower half of the block diagram described above. The inverter circuit INV is coupled between the positive potential Vcc and the ground potential Vss. That is, the silicon transistor and the compound transistor in each of the first and the second semiconductor device HSW and LSW in the system SYS1 are driven so as to have a period in which the both transistors are in an OFF state.

Furthermore, the upper-arm switching circuits HSW, SWU, SWV, and SWW, which configure the inverter circuit of the systems SYS and SYS1, may be driven in the same manner as in the switching circuit SW2 illustrated in FIG. 12. That is, the silicon transistor and the compound transistor of each of the switching circuits HSW, SWU, SWV, and SWW may not have a period in which the both transistors are in an OFF state. What is necessary is to drive the silicon transistor and the compound transistor of each of the lower-arm switching circuit LSW, SWX, SWY, and SWZ so as to have a period in which the both transistors are in an OFF state. Accordingly the gate-driver control circuit can be simplified rather than the gate-driver control circuit GDCTL illustrated in FIG. 5.

3. Structure of the Semiconductor Device

Figure 7A:
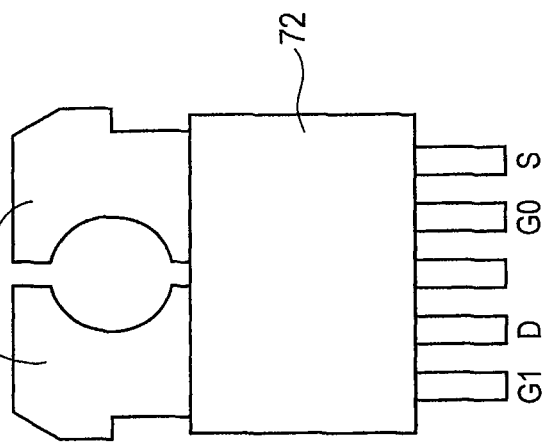
FIG. 7A and FIG. 7B are drawings illustrating plan views of the semiconductor device according to the embodiment.
Figure 7B:
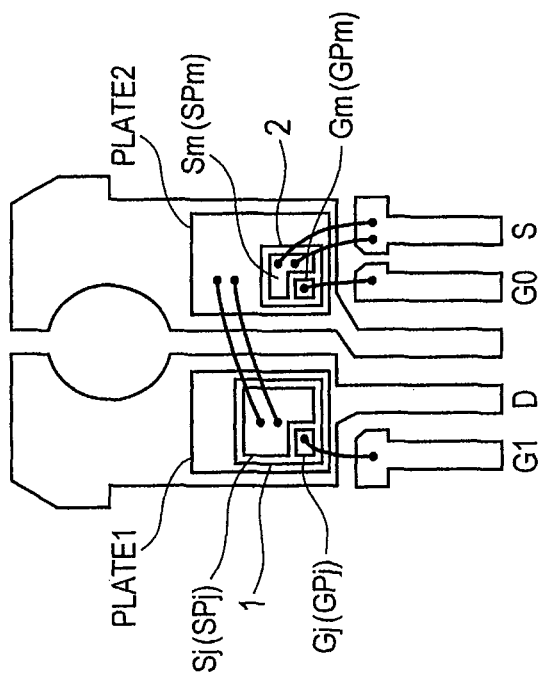

FIGS. 7A and 7B illustrate a semiconductor device in which the Si-type MOSFET 4 and the SiCJFET 3 illustrated in FIG. 1 are sealed in one package. FIG. 7A illustrates a plan view of the semiconductor device sealed with resin, and FIG. 7B illustrates a plan view of the semiconductor device of which the resin is removed. As illustrated in FIG. 7A, the semiconductor device 70 is covered with sealing resin 72 except for leads of the gate terminals G0 and G1, the drain terminal D, the source terminal S, etc. and a header 71. FIG. 7B illustrates an example in which among two metal plates PLATE1 and PLATE 2 to be sealed with the sealing resin 72, a semiconductor chip 2 provided with the Si-type MOSFET 4 is arranged in the metal plate PLATE2 on the right-hand side, and a semiconductor chip 1 provided with the SiCJFET 3 is arranged in the metal plate PLATE1 on the left-hand side. By employing a bonding wire, a gate pad GPm coupled to the gate electrode Gm of the Si-type MOSFET 4 is coupled to the gate terminal G0 which is a lead (a first lead) projecting from the sealing resin 72, and a source pad SPm coupled to the source electrode Sm is coupled to the source terminal S which is a lead (a second lead) projecting from the sealing resin 72. The source pad SPm and the source terminal S are coupled with plural bonding wires. The drain electrode located in the back of the semiconductor chip 2 is coupled to the metal plate PLATE2 with a die bonding material. On the other hand, by employing a bonding wire, a gate pad GPj coupled to the gate electrode Gj of the SiCJFET 3 on the left-hand side is coupled to the gate terminal G1 which is a lead (a third lead) projecting from the sealing resin 72, and a source pad SPj coupled to the source electrode Sj is coupled to the metal plate PLATE2, that is, the drain electrode of the Si-type MOSFET 4. The source pad SPj and the metal plate PLATE2 are coupled by plural bonding wires. The drain electrode located in the back of the semiconductor chip 1 is coupled to the metal plate PLATE1 with a die bonding member. The metal plate PLATE1 and the drain terminal D which is a lead (a fourth lead) projecting from the sealing resin 72 are formed in one body. As illustrated in FIG. 7B, the chip area of the semiconductor chip 2 is smaller than the chip area of the semiconductor chip 1.

By adopting the arrangement and coupling configuration of the semiconductor chip as described above, it is possible to shorten the length of the bonding wire which couples the gate electrodes of the SiCJFET 3 and the Si-type MOSFET 4 and the leads, and the length of the bonding wire which couples the source electrode and the lead. That is, it is possible to reduce the parasitic inductance Lj of the bonding wire and the parasitic resistance (on-resistance component) originating from the bonding wire. Therefore, it is possible to reduce a noise at the time of switching and to prevent a surplus potential from being applied to the Si-type MOSFET. In other words, it is possible to set the withstand voltage of the Si-type MOSFET at a low value; therefore, it is possible to reduce the on-resistance of the entire elements which are coupled in a cascade switch, leading to a reduced loss. The right-hand side metal plate PLATE2, which is an opposed electrode of the bonding wire coupled to the source electrode of the SiCJFET, can take a large portion of margin where the semiconductor chip provided with the Si-type MOSFET is not arranged. Therefore, it becomes possible to couple the source electrode of the SiCJFET with the metal plate PLATE2, by use of a clip bonding-type coupling member with a large contact area (a plate-shaped metal, for example, a Cu frame); accordingly there is also an advantage that the contact resistance can be reduced. Since at least two or more number of wires can be bonded, it also becomes possible to further reduce the parasitic inductance produced in the intermediate node (the drain Sj) which is a coupling point of the Si-type MOSFET and the SiCJFET. Furthermore, since plural chips are arranged in a plane, it is possible to freely design the area of the semiconductor chip in which the Si-type MOSFET and/or the SiJFET are formed. Therefore, the design of low on-resistance and the design of on-state current density also become easy, and it becomes possible to realize the semiconductor device (the power semiconductor device) of more various specifications.

Figure 8A:
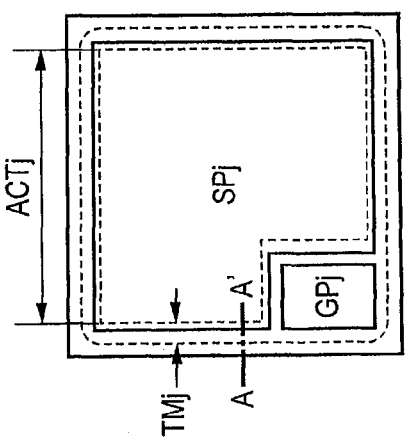
FIG. 8A and FIG. 8B are drawings illustrating the structure of a SiCJFET according to the embodiment.

FIG. 8A illustrates a plane layout of the semiconductor chip 1 in which the SiCJFET 3 is formed. The gate pad GPj and the source pad SPj are arranged on the surface (upper surface) of the semiconductor chip 1, and the drain electrode DRAINj is arranged on the reverse side (under surface) of the semiconductor chip 1. That is, the semiconductor chip 1 is a so-called vertical-type JFET. The area of the source pad SPj is made larger than the area of the gate pad GPj. The source pad SPj has an adjoining portion which faces two sides of the gate pad GPj. The end of a termination region TMj is located between the end of the semiconductor chip 1 and the source pad SPj or the gate pad GPj. The termination region TMj is located between an active element region ACTj and the end of the semiconductor chip 1. That is, the termination region TMj is located in the exterior of the active element region ACTj. The gate pad GPj is located in the corner formed by intersecting two sides of the semiconductor chip 1. The gate pad GPj is located over the termination region TMj. The end of the active element region ACTj is located at the inner side of the source pad SPj. It is possible to arrange the position of the gate pad GPj freely by rotating the semiconductor chip 1; therefore, when implementing the semiconductor chip 1 as illustrated in FIG. 7B, it is possible to arrange it so that the wire length of the wire bonding may be shortened.

Figure 8B:
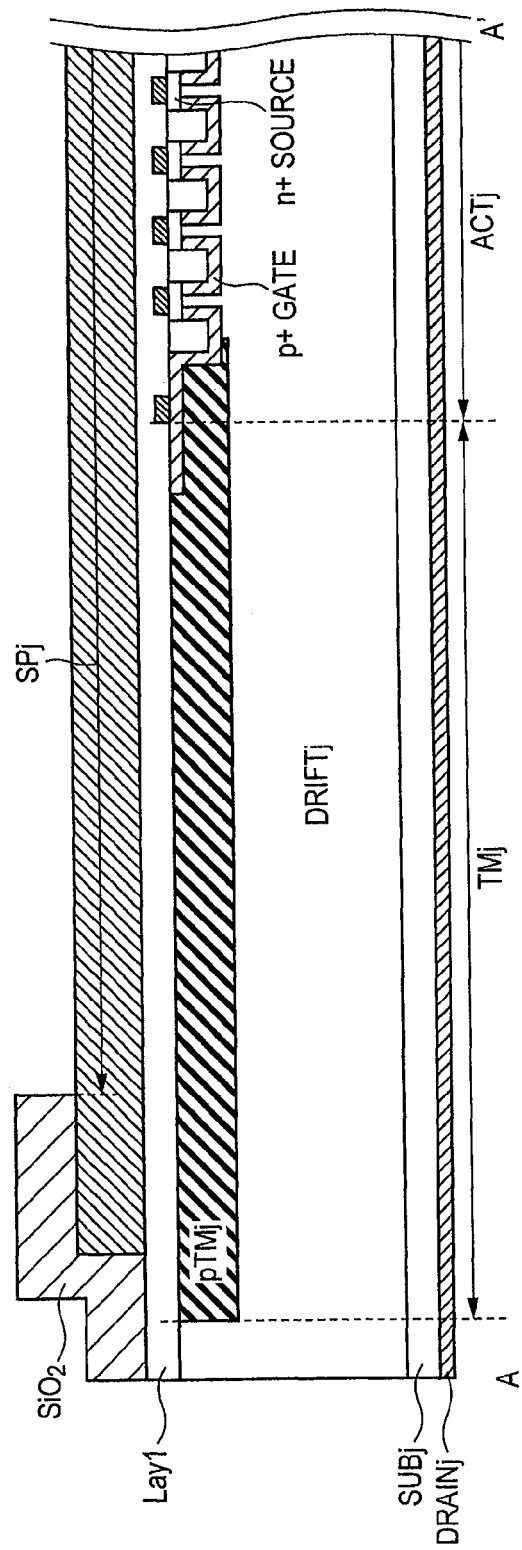

FIG. 8B is a sectional view illustrating the cross section of an A-A' section in FIG. 8A. A drift layer DRIFTj is located over a compound semiconductor substrate SUBj. A drain electrode DRAINj is located under the compound semiconductor substrate SUBj. That is, the drain electrode DRAINj is arranged on the reverse side (under surface) of the semiconductor chip 1. A gate electrode p+gate is located over the drift layer DRIFTj in the active element region ACTj, and a source electrode n+source is located over the gate electrode p+gate. A semiconductor region pTMj which forms a termination region TMj is arranged over the drift layer DRIFTj in the termination region TMj. The source pad SPj is located over the semiconductor region pTMj and the source electrode n+source, through an interlayer insulation film Lay1. Serving as the source pad SPj is a section which is a part of a conductor layer such as aluminum located over the interlayer insulation film Lay1 and which is not covered by an oxide film SiO2 as a passivation film over the conductor layer. By arranging the termination region pTMj around the active element region ACTj, it is possible to secure the active element region sufficiently in the semiconductor chip; accordingly, it becomes possible to increase the on-state current, that is, to reduce the on-resistance.

FIG. 9A and FIG. 9B illustrate principal part sectional views of the active element region ACTj of the SiCJFET 3. FIG. 9A illustrates a cross section of the vertical-type SiCJFET which has a trench structure, that is, FIG. 9A is the principal part sectional view of the active element region ACTj illustrated in FIG. 8B. In the case of the trench structure, it is preferable to set the depth of the gate electrode p+gate ("depth" in the figure), that is, the channel length of the SiCJFET, to at least him or greater. When the gate electrode depth "depth" is large, it is possible to make high the electrostatic potential in the channel at the time when the SiCJFET is in an OFF state. Therefore, it is possible to reduce the leakage current between the drain and the source, compared with the structure in which the gate electrode has a shallow depth of about 0.5 μm. In this case, the drain leakage current flows into the gate electrode p+gate; therefore, after the SiCJFET is cut off, it is possible to suppress the rise of the source voltage of the SiCJFET, and hence, the drain potential of the Si-type MOSFET in cascade connection. That is, by adopting the element structure described with reference to FIG. 9A in the SiCJFET 3 described in Embodiment 1, it is possible to provide the more reliable semiconductor device of which the Si-type MOSFET 4 is hard to be destroyed. It is needless to say that it is possible to realize a switching circuit SW with a large current density by employing the SiCJFET of the trench structure. FIG. 9B illustrates a cross section of a vertical-type SiCJFET which does not have the trench structure. That is, FIG. 9B is not a principal part sectional view of the active element region ACTj illustrated in FIG. 8B, but illustrates another embodiment. In this case, there is an advantage that the element structure is simple and the production cost is low. In FIG. 9A, the p+ layer is formed in a sidewall part by oblique ion implantation or other means; on the contrary, in FIG. 9B, it is not necessary to perform oblique ion implantation, and the high degree of accuracy is obtained in the profile of impurity concentration. Therefore, there is an advantage that it is possible to easily form the SiCJFET with uniform characteristics. As is the case with FIG. 9A, it is preferable to set the depth of the gate electrode p+gate of the SiCJFT illustrated in FIG. 9B to 1 μm or greater. By adopting the structure described above, it is possible to obtain an effect equivalent to the effect obtained in FIG. 9A.

Figure 10:
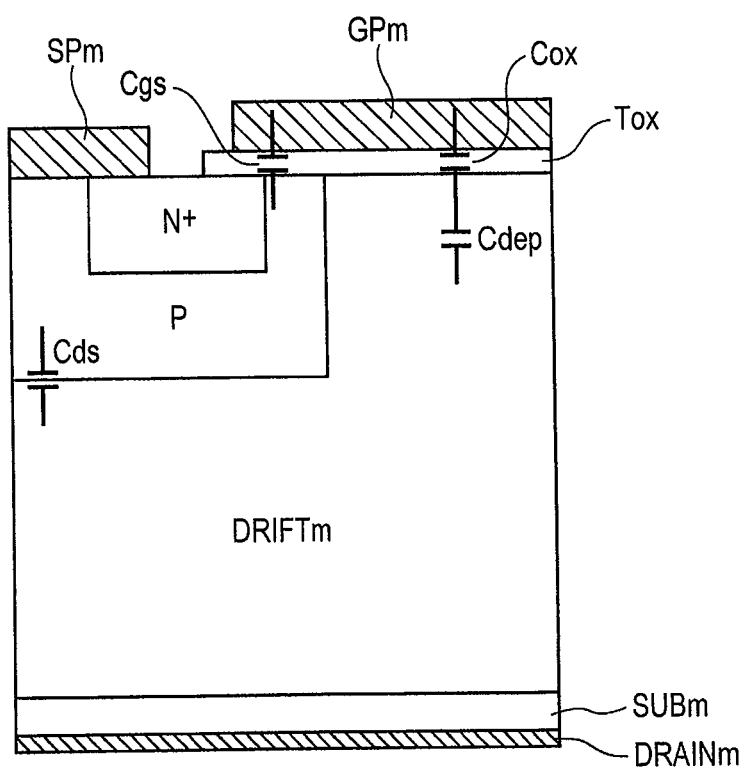
FIG. 10 is a drawing illustrating a sectional view of the structure of a MOSFET according to the embodiment.

FIG. 10 illustrates an element cross section of the semiconductor chip 2 in which the Si-type MOSFET 4 is formed. The plane layout of the semiconductor chip 2 is the same as that of the semiconductor chip 1, as seen from FIGS. 7A, 7B, and 8A. However, the area of the source pad SPm is smaller than the area of the source pad SPj; consequently the semiconductor chip 2 is smaller than the semiconductor chip 1. As illustrated in FIG. 10, a drift layer DRIFTm is located over a silicon semiconductor substrate SUBm. A drain electrode DRAINm is located under the silicon semiconductor substrate SUBm. A P-type semiconductor area P exists in the drift layer DRIFTm, and an N-type semiconductor area N+ exists in the P-type semiconductor area P. A gate electrode GPm is located over the N-type semiconductor area N+, the P-type semiconductor area P, and the drift layer DRIFTm, through the intermediary of an oxide film Tox. A source electrode SPm is located over the N-type semiconductor area N+ and the P-type semiconductor area P. The gate electrode GPm and the source electrode SPm are separated. As understood from FIG. 10, this Si-type MOSFET is the so-called vertical-type MOSFET of a bottom drain type. By employing the MOSFET with the structure illustrated in FIG. 10 as the Si-type MOSFET 4 described in Embodiment 1, it is possible to realize a switching element with a larger current density. That is, it is possible to reduce the on-resistance of the switching elements coupled in cascade; accordingly, it becomes possible to provide a switching circuit SW with a reduced loss.

According to the embodiment described above, the semiconductor device comprises a pair of terminals, a silicon transistor, and a compound transistor, in which the source-to-drain paths of the silicon transistor and the compound transistor are coupled in cascade between the pair of terminals, and the silicon transistor and the compound transistor are driven on the basis of one input signal (an input signal which turns on and off the switching circuit) so as to have a period in which both transistors are set in an OFF state. By setting both transistors in an OFF state according to the input signal, it becomes possible to enhance the reduction of a leakage current which flows between the pair of terminals. When the pair of terminals are set conducted (set in an ON state), the semiconductor device is driven so as to set the silicon transistor in an ON state before setting the compound transistor in an ON state. By this setting, it becomes possible to suppress a surge potential which is generated by the parasitic impedance of a wiring coupling the compound transistor and the silicon transistor, and consequently it becomes possible to reduce a possibility of destruction of the transistors. Furthermore, when the pair of terminals are set non-conducted (set in an OFF state), the semiconductor device is driven so as to set the compound transistor in an OFF state before setting the silicon transistor in an OFF state. By this setting, it becomes possible to enhance the reduction of the surge potential generated by the parasitic impedance, and consequently it becomes possible to reduce a possibility of destruction of the transistors.

The embodiment described above has presented the example in which silicon carbide (SiC) is employed as a material of a JFET. However, compound semiconductors, such as a gallium nitride (GaN), may be employed as a material. For example, by employing a gallium nitride (GaN) as a material of a JFET of an inverter circuit and by applying the embodiment described above, it is possible to make the inverter circuit perform switching at an increased operating frequency. Consequently, the passive element employed for the inverter circuit can be miniaturized; therefore, it is possible to enhance the reduction in size and the realization of low cost of the power conversion system. FIG. 3 illustrates the application of the three-phase inverter circuit; however, the application is not restricted to the example naturally. It is needless to say that the same effect is obtained even when the semiconductor device according to the present invention is applied to various systems, for example, an inverter device of an air-conditioner, a power conditioner of a solar energy power generation system, an inverter device for driving of a hybrid car, and others.

As described above, the invention accomplished by the present inventors has been concretely described based on the embodiments. However, it cannot be overemphasized that the present invention is not restricted to the embodiments, and it can be changed variously in the range which does not deviate from the gist.

The invention claimed is:

1. A semiconductor device comprising:
   a pair of terminals;

a normally-off silicon transistor provided with a gate, a source, and a drain; and a normally-on compound transistor provided with a gate, a source, and a drain, of which a source-to-drain path is coupled between the pair of terminals via a source-to-drain path of the silicon transistor, wherein the gate of the silicon transistor and the gate of the compound transistor are both driven by one input signal, so as to have a period in which both transistors are in an OFF state, wherein the silicon transistor is a MOSFET and the compound transistor is a SiCJFET, and wherein, when the pair of terminals are set non-conducted, the gate of the silicon transistor and the gate of the compound transistor are both driven so as to set the compound transistor in an OFF state before setting the silicon transistor in an OFF state.

2. The semiconductor device according to claim 1, wherein, when the pair of terminals are set conducted, the semiconductor device is driven so as to set the silicon transistor in an ON state before setting the compound transistor in an ON state.

3. The semiconductor device according to claim 2, wherein the compound transistor and the silicon transistor are sealed in one package, wherein a gate of the silicon transistor is coupled to a first lead projected from the package, wherein a source of the silicon transistor is coupled to a second lead projected from the package, wherein a gate of the compound transistor is coupled to a third lead projected from the package, and wherein a drain of the compound transistor is coupled to a fourth lead projected from the package.

4. The semiconductor device according to claim 1, further comprising:

a delay circuit, which receives the one input signal, has a plurality of inverters to delay the one input signal to the normally-on compound transistor when setting both transistors to an ON state, and a plurality of inverters to delay the one input signal to the normally-off silicon transistor when setting both transistors to the OFF state.

5. A system comprising:
a load device; and
a first and a second semiconductor device each coupled to the load device,
wherein each of the first and the second semiconductor devices comprise:
a pair of terminals;
a normally-off silicon transistor provided with a gate, a source, and a drain; and
a normally-on compound transistor provided with a gate, a source, and a drain, of which a source-to-drain path is coupled between the pair of terminals via a source-to-drain path of the silicon transistor, wherein one of the pair of terminals in the first semiconductor device is coupled to the load device, and the other of the pair of terminals in the second semiconductor device is coupled to the load device, wherein the gate of the silicon transistor and the gate of the compound transistor in each of the first and the second semiconductor device are both driven so as to have a period in which both transistors are in an OFF state, and wherein each of the first and the second semiconductor devices further include:

a delay circuit, which receives one input signal to drive both transistors, that has a plurality of inverters to delay the one input signal to the normally-on compound transistor when setting both transistors to an ON state, and a plurality of inverters to delay the one input signal to the normally-off silicon transistor when setting both transistors to the OFF state.

6. The system according to claim 5,
when one of the silicon transistor and the compound transistor in the first semiconductor device is set in the ON state, the silicon transistor and the compound transistor in the second semiconductor device are set in the OFF state.

7. The system according to claim 6,
wherein the load device includes a motor.

8. The system according to claim 6,
wherein the load device includes a coil.

9. A system comprising:
a load device;
an inverter circuit coupled to the load device; and
a control circuit operable to drive the inverter circuit,
wherein the inverter circuit comprises:
  a pair of terminals;
  a normally-off silicon transistor provided with a gate, a source, and a drain;
  a normally-on compound transistor provided with a gate, a source, and a drain, of which a source-to-drain path is coupled between the pair of terminals via a source-to-drain path of the silicon transistor,
wherein, in response to one input signal, the control circuit generates a first control signal to be supplied to the gate of the silicon transistor and a second control signal to be supplied to the gate of the compound transistor based on the one input signal, and controls the silicon transistor and the compound transistor so as to have a period in which both transistors are in an OFF state, and the system further comprises:
a delay circuit, which receives the one input signal, that has a plurality of inverters to delay the second control signal to the normally-on compound transistor when setting both transistors to an ON state, and a plurality of inverters to delay the first control signal to the normally-off silicon transistor when setting both transistors to the OFF state.

* * * * *